United States Patent [19]

Immega et al.

[11] Patent Number: 5,726,443
[45] Date of Patent: Mar. 10, 1998

[54] VISION SYSTEM AND PROXIMITY DETECTOR

[76] Inventors: Guy B. Immega, 4356 Jericho Circle, Vancouver B.C., Canada, V6R 1E9; Glenn H. Chapman, 637 Ebert Ave., Coquitlam B.C., Canada, V3J 2L1

[21] Appl. No.: 588,319

[22] Filed: Jan. 18, 1996

[51] Int. Cl.$^6$ .................................................. G01J 1/06
[52] U.S. Cl. ........................... 250/227.2; 250/208.1; 250/221
[58] Field of Search .......................... 250/221, 208.1, 250/237 R, 559.31, 559.29, 227.2; 382/124, 125, 126, 127

[56] References Cited

U.S. PATENT DOCUMENTS

| | | | |
|---|---|---|---|
| 4,015,122 | 3/1977 | Rubinstein | 250/221 |
| 4,498,767 | 2/1985 | McGovern et al. | 356/121 |
| 4,583,126 | 4/1986 | Stoffel | 358/294 |
| 5,136,150 | 8/1992 | Fukushima et al. | 250/208.1 |
| 5,426,296 | 6/1995 | Shikai et al | 250/227.2 |

*Primary Examiner*—Edward P. Westin
*Assistant Examiner*—Kevin Pyo
*Attorney, Agent, or Firm*—David J. French

[57] ABSTRACT

A vision system and proximity detector is provided in the form of an occluding mask with multiple high aspect light pathways positioned over a light detecting surface. Pixel-based images can be generated to provide a vision system utilizing a variety of illumination modes. Proximity can be measured with a triangulating beam.

31 Claims, 18 Drawing Sheets

Intensity Above Light Cell 6
(Source at 8 cell intervals height above sensors)

VISION SYSTEM AND PROXIMITY DETECTOR

FIELD OF THE INVENTION

This invention relates to a vision sensor suited for use in robotics applications as well as for general imaging. In particular, it provides an apparatus for optically detecting the proximity of and observing objects at close ranges.

BACKGROUND OF THE INVENTION

In the field of vision systems, images are generally formed using refractive or reflective lens elements. Such imaging systems gather a cone of light coming from a point on a viewed object and focus the light so gathered as a point on a focal plane. The collective reassembly of light originating from multiple points over the surface of the viewed object creates an image.

Non-imaging visual systems are generally associated with the compound eyes of insects. Such compound eyes receive light through a large number of receptors that individually or collectively do not recreate an image of the viewed object in the sense described above.

Attempts have been made to produce artificial vision systems based on compound eye principles. A number of papers published in this field describe systems that operate on the basis of gathering and concentrating light into individual receptors through the use of refractive, light gathering lenses associated with each receptor. As such, the viewed portion of the surface of an object being examined is effectively being imaged onto the light receptor.

Refractive lenses suffer from the problems of limited wavelength range and aberrations (chromatic, spherical, astigmatism). Glass is not sufficiently transparent beyond the near infra-red and is too absorptive in the far ultra-violet range of the spectrum so a more inconvenient or expensive material must be used to provide lenses in these regions. A lens in a fixed position relative to the optical detectors will have a specific focal length, and limited depth of focus. Any object closer than the focal length of the lens cannot be brought into focus on the light sensing receptors.

A compound vision system that does not rely on refractive lenses and wherein the area of an examined surface approximates the area of the light reception surface is that described in an article in the American magazine "Advanced Imaging" as follows:

"Lensless Microscopy: Where It Stands Now" by Jeremy Chambers and Kendall Preston Jr. Advanced Imaging, July 1994, pp 68–77.

An apparently related patent is U.S. Pat. No. 4,777,525 issued 11 Oct., 1988 and entitled "Apparatus and Method for Multi-Resolution Electro-Optical Imaging, Display and Storage/Retrieval Systems".

In this system a "contact print" image of a biological specimen mounted on a slide is prepared by passing the specimen directly against a line-scan diode-array sensor while light is being projected through the specimen into the diode receptors. Consecutive readings of the output from the diode-array are stored in a computer memory and presented on a video monitor as a restored image. As this system places the viewed object very near the light sensors, it does not operate by viewing articles placed at a distance from such sensors. It does, however, provide a means to recreate an image of an object, electronically, without use of a lens.

A lensless light sensor system based on a photo diode array to receive light originating at a distance is that described in U.S. Pat. No. 4,498,767 to McGovern and Tsao. This patent describes the placement of a light-restricting mask over an array of photo diodes so as to restrict the exposure of each diode to receiving light from a narrow angular field of view. The mask is based on the use of two perforated sheets carrying holes that are in register with each other and with respectively assigned photo-diodes.

The objective of this arrangement is to provide a detector that will measure the degree of collimation of light to be used to expose a photo resist surface in the production of layered semi-conductor devices. No attempt is made to obtain a representation of a viewed scene.

A proximity measuring system based on the use of optical fibres is describes in U.S. Pat. No. 3,327,584. This system, which intermixes transmitting and receiving fibres, is able to determine the proximity of objects at very close distances. It is not, however, designed to provide images.

A further lensless system for obtaining an image for use in gamma ray tomography is a gamma ray camera as described in U.S. Pat. No. 5,365,069. As gamma rays cannot be refracted, this camera receives gamma rays within a 64×64 (or 128×128) pixel sensing array after such rays have passed through a collimating mask. This mask, made of a gamma ray absorbing material such as lead metal, provides narrow passages of uniform, converging or diverging proportions by which gamma rays may access each pixel sensor only along a narrow, conical angle of view. The gamma rays so detected provide a map of the location of gamma ray sources within the viewed object.

There is a need for a vision system that will enable visual representation of an object placed at a relatively short distance to be formed without being subject to the focusing limitations that arise through use of refractive lens.

Further, in many robotics applications there is a need to obtain images of an object at short distances (a few millimeters to centimeters) before a robotic manipulator makes contact with some object. Lens systems suffer from a difficulty in maintaining a focus as the object approaches the contact point because of limited depth of field. Fibre-based systems suffer limitations in that the acceptance angle of the fibres, which determines the resolution at a given distance, is set by the index of refraction of the fibre. While multiple lens systems can give a stereo image of an object, fibre systems have difficulty combining two separate images in the same devices. Both lens and fibre systems are very wavelength sensitive.

An object of this invention is, therefore, to provide a system which removes the depth of focus problems of the lens at short distances, can have smaller and more controllable acceptance angles than a fibre systems and can provide stereo images which a fibre system has difficulty producing.

A particular application of such a vision system is the determination of the proximity of a viewed article.

In the field of optical proximity measurement, a known device based on triangulation is disclosed in U.S. Pat. No. 4,893,025 to Lee. In this reference, light beams are emitted at an angle from a surface that also includes a number of light receptors. Light reflected from an object and received by a detector defines a triangular path. From the measured geometry of this triangular path, the distance separating the illuminated object from the detector can be determined.

This reference relies upon discrete light receptors with lenses that are able to sense the presence of light coming from a large number of differing illuminated spots on the illuminated object. It provides an image that is projected by lenses over a specially shaped light sensing surface. The locations of each illuminated spot on the sensing surface is correlated with the angular beam of the source of each illuminated spot. The resulting information is used to calculate distance to the illuminated spot. A feature of this system is that it can be used to obtain a surface profile of the illuminated object.

At short working distances, however, this system encounters the problem of short depth-of-focus operation, which makes it very difficult to do laser spot proximity measurement at a few millimeters distance.

There is a need for an optical proximity detection system that is able to detect the distance to an object at short ranges. There is also a need for a system to sense the shape of the surface of an object in order to establish the angular orientation of the viewed object with respect to the optical sensor. Preferably such a system would operate without reliance upon refractive elements that introduce abberations or have a limited depth of field of focus and be suitable for incorporation into a robotic manipulator or end-effector. It is, therefore, an object of the present invention to address such needs.

The invention in its general form will first be described, and then its implementation in terms of specific embodiments will be detailed with reference to the drawings following hereafter. These embodiments are intended to demonstrate the principle of the invention, and the manner of its implementation. The invention in its broadest and more specific forms will then be further described, and defined, in each of the individual claims which conclude this Specification.

SUMMARY OF THE INVENTION

Broadest Aspect

In a broad aspect this invention relates to an optical detection system wherein electromagnetic radiation below the X-ray region of the electromagnetic spectrum, and particularly light from a viewed scene, is provided to a pixel-generating or area light sensing detector. This detector may comprise a linear or area sensor surface with light sensor regions on the sensor surface which may be in the form of a plurality of discrete light receptor sensors to generate an array of pixels. Or this detector may be in the form of any other linear or area light detector system that generates signals corresponding to the location of light, and preferably the intensity of light, arriving at the sensor surface.

In either case, the electromagnetic rays or light arrives at the detector after passing through an occluding shadow mask that limits the field of view of each region or portion of the detector to a narrow conical angle. The light directed to each such portion is substantially parallel in that it has a narrow range of angular dispersion. The narrowed, generally conical, field of view for each light detecting portion of the detector may be provided by straight, light transmitting pathways formed in a solid, occluding mask. Or such fields of view can be provided by aligned openings in two or more plates that carry openings that align with openings in adjacent plates to provide the equivalent of a solid occluding mask. In either case, a "shadow mask" or mask is provided as part of the invention. The occluding mask may be a separate component affixed to a light sensor substrate, or it may be manufactured as an integral part of the light sensing unit.

The occluding shadow mask functions in a manner opposite to fiber optics which are designed to have a high numeric aperture and TIR (total internal reflection of light). Instead, the occluding shadow mask has a very narrow numeric aperture and absorbs off-angle light.

An occluding mask may be comprised of multiple plates or layers (hereinafter called a multi-layer mask) and such layers may be separated by spaces or transparent elements that increase in thickness proceeding towards the light receptors. In one variant the first plate is of a specific thickness while the remaining plates are thin layers of a thickness that is sufficient to occlude light.

It is preferable that the light transmitting pathways (or the multi-plate equivalents) have an aspect ratio (that is a ratio of length to width) that exceeds 3:1, preferably between 10:1 and 20:1, or more.

By providing light transmitting pathways that are densely packed, the cross-sectional area of the pathways preferably being greater than 20% of the surface area of the mask, a relatively fine detailed sampling can be made of light originating from the surface of the viewed object. This provides a high pixel density for the viewed scene.

The invention is intended to operate across the electromagnetic spectrum except as otherwise provided herein. Reference to "light" herein is intended to cover this range and is not restricted to visible light. To provide a high density of light pathways the shadow mask should have inter-pathway surfaces that block cross-illumination at their surfaces and therefore should operate below the X-ray region of the electromagnetic spectrum. This invention may be applied from and including the far ultra violet region of the spectrum. At the other end of the electromagnetic spectrum, the invention will work into the near or far infrared region of the spectrum to the extent that suitable sensors are available and that the shadow mask light pathways are of dimensions that will admit substantially parallel rays of infrared light.

The viewed area of the object produced by the invention at "zero" distance will equal exactly the cross-sectional area of the light transmitting pathways. The percentage of the area of the object viewed is then equal to the percentage of the area of the mask occupied by such pathways. The surface of the viewed object will, however, be under sampled by the receptors.

As the object recedes from the detector, the expanding cone of light reception of each passageway will enlarge the viewed area on the object. At a certain point the viewed areas of adjacent pathways will become contiguous. Thereafter, as the distance between object and detector increases, the viewed areas will overlap more and more. The stage at which the viewed areas are contiguous, when the vision system has effectively "tiled" the surface of the subject object, is the "working distance" of the system.

Beyond the working distance, useful vision information can be obtained, but with decreasing precision since individual light sensing portions of the detector are being activated by discreetly associated, independent areas of the viewed object. The effective pixel density for viewing the object, therefore, drops as more and more pixels are substantially viewing or cross-sampling the same overlapping areas. However, at longer distances, larger objects can still be adequately sensed, albeit with a reduced pixel density and therefore a reduced acuity.

For a limited range beyond the system's "working-distance", signal processing for over-lapping fields of view can improve the acuity of the system, especially when the distance to the object is known.

If a high pixel density is initially provided, then the system can tolerate a loss of effective pixel density by discarding or merging a portion of pixel signals being generated. Thus, useful viewing of an object may range up to several or more times the basic "working distance" of the system by recognizing that differing "working distances" are available at corresponding differing levels of acuity. The ideal system based upon these principles should therefore have a maximum possible density of light-detecting sensor regions and an associated occluding mask with high aspect ratio, light transmitting pathways.

When used for the visible light spectrum, the detector or detectors located beneath the shadow mask may be a planar or linear receptor array using either photo diodes, a Charged Coupled Device array (CCD) or other types of pixel-generating light detectors. This may include a Position Sensing Detector modified for imaging applications (as described further below). Standard commercially available CCD's exist which have light receptors spaced at 13 micron intervals. Such devices may be combined with electronic circuitry to provide light intensity measurements over a 192 by 165 pixel array within a space of 2.6 mm by 2.6 mm. Arrays of 70 mm×70 mm have been successfully built. Examples of suitable detector materials or technology for other regions of the electro-magnetic spectrum are as follows:

near infrared—silicon photo diodes AgCdTe far infrared—AgCdTe ultra violet—Charge Coupled Devices (CCD's)

Use of the basic detection system of the invention is not claimed in the X-ray or gamma ray range of the electromagnetic spectrum. The present invention as applied to electromagnetic waves below the X-ray range may be distinguished from the prior art by the fact that the invention relies upon radiation blocking surfaces to block cross-illumination between receptors.

Throughout, when reference is made to "light", this is intended to be directed to electromagnetic radiation from the far infrared region to the far ultra violet region of the electromagnetic spectrum.

"Swept" Extraction of Images

For the purpose of extracting an image of an object, it is not necessary for the entire surface of the object to be exposed simultaneously to a planar array of light receptors. It is sufficient, as a more general feature of the invention, for the object to be swept over or passed by a linear or truncated planar array of receptors provided with a shadow mask that limits the light arriving at each receptor portion of the detector to a narrow angular field of view.

As the viewed object is being swept past the detector array, received light reflected from the object's surface may be repeatedly stored in digitized form in a computer memory for subsequent creation of a restored image on a cathode ray tube (CRT) screen or other viewing system.

When a two dimensional array of pixel-generating light receptors is employed as the detector, as for example a CCD, each receptor may be polled consecutively to produce pixel values for the similar creation of an image on a CRT screen.

Modes of Illumination

An advantage of the invention not available with prior art refractive lens systems is that close-up viewing of areas on objects can be effected without focusing limitations. This, however, presents the complication of providing illumination for a viewed object that is effectively being covered or screened by the close proximity of the vision system.

In conventional optical systems light is customarily shone on the viewed object from a laterally located light source that is somewhat removed from the viewed object. This may not be practical when the close-up positioning of the optical detection assembly greatly reduces the scope for remote illumination of the viewed object. However, the optical detection system of the invention readily admits arrangements to illuminate the viewed object from light sources positioned at the immediate sides of the light detector, from the rear of the viewed object when such object is translucent, or from the face of the light detector itself as further described below.

Exterior Illumination

Because of the screening-effect provided by the mask, illuminating light for viewing an object can originate from the immediate periphery of the mask and be directed by other structures exterior to the mask, such as mirrors, diffusers or light guide means, to light a viewed object. Translucent objects can be illuminated from the rear of such objects.

Color Vision

To record a color image of a viewed object, the object may be flooded with colored light cycling between three primary colors on a regular basis. Illumination from colored light sources, for example red, green and blue, can be provided in sequence in conjunction with use of a monochromatic detector. The monochrome images so formed, if provided with a timing marker, can then be used to produce three separate images corresponding to each color. In this manner, an image receiving means can assemble three monochrome red, green and blue images into a full color image.

Illumination via Light Pathways

By providing two or more classes of light pathways through the occluding mask a viewed object can be illuminated through one of such classes of pathways while the other class of pathways is used to receive light. Due to the preferred high aspect ratio of such pathways, light introduced therein from the base or light sensing surface side of the mask will proceed outwardly from the mask surface in a narrow cone, producing a limited illuminated zone on a viewed object. For objects beyond the working distance such illuminated zones will be overlapped. By interspersing the light emitting pathways with the light receiving pathways, intimate illumination of the viewed object can be provided at close distances and at low levels of intensity. Alternately or concurrently, peripherally located light illumination pathways angled inwardly towards the center of the sensor array can provide illumination, and in particular can create shadows that are useful in interpreting the illuminated surface.

A single, bulk, light source can be located at the base end side of the mask itself by placing a light emitting layer below the lower surface of the mask and the substrate carrying the light detector. Suitable materials include electroluminescent phosphors that can be positioned beneath or even coated over the bottom of the structure carrying the illuminating pathways. A convenient bulk light source may be a laser beam expanded over a large area or any distributed light source, such as a florescent light, whose light is oriented to enter the illuminating light pathways, as by the use of a diffuser. Alternately, individual discrete light sources associated with individual illuminating pathways may be employed.

By illuminating an object through angled illuminating light pathways that are interleaved with the light-receiving pathways useful shadows of controlled lengths may be created even in the central area of the scene being viewed. Such illumination may be adjusted through a selection of the angles of such illuminating light pathways.

Illumination Off The Mask

A further option is to provide illumination off the upper surface of the mask itself. This may be obtained by coating the top surface of the mask with an electro luminescent panel so as to provide a light-emitting panel. This coating or panel should be positioned so as to avoid introducing light into or occluding the light pathways. Thus, it should have light transmitting regions that are in register with the light pathways in the mask.

Proximity Ranging

As a separate application to viewing an object's surface for the purposes of image generation, the invention can be used in conjunction with known triangulation techniques for range finding and proximity detection. In this variant, a source or sources of angularly directed light may be provided in narrow beams from sources located peripherally to the mask or on the mask itself.

The detection of an exemplary illuminated spot arising from such a beam of light as it falls on the viewed object (as detected by the light receiving class(es) of pathways) can be used by triangulation to determine proximity. If the diameter of the laterally originating ranging beam is on the order of that of the apertures in the mask then, within the focal length of the system, the correlation of a detected spot with its source can be precise. Alternately, it a spot is detected by several sensor portions in the detector, then a reading of grey-scale values will allow sub-pixel interpolation of the centre, or centroid, of the illuminated region on the detector.

The simplest means to estimate the laser spot location is to choose the brightest spot as viewed by the most excited sensor portion or receptor. However, when the laser spot is located between several light pathways and is in the fields of view of more than one sensor portion, then an interpolation can be made to obtain greater accuracy in locating the centroid of the spot.

When the object is far from the detector, or when the laser spot is large enough that three or more sensor portions or receptors are illuminated, then a simple three point interpolation of the peak of light intensity can be obtained from those points nearest the receptor that is sensing the maximum spot. These points may be designated as Imax, Imid and Imin, assuming the sensor portions to be in a line and that the values for these parameters designate distances along the line of receptors from an origin, which origin may be located at the source of the triangulating beam. The displacement "dxpeak" along the line of the receptors proceeding from the Imax receptor towards the Imid receptor of the point that corresponds to the centroid of the illuminated spot on a viewed objet is then given by:

$$dxpeak = \frac{L(Imid - Imin)}{2(Imax - Imin)}$$

where L is the interval between the light pathways or mask holes.

Tests have shown that this formula provides distance measurement values with errors of less than 0.1 L for object distances that are located at 10 times the "working distance" from the detector surface.

When the viewed illuminated spot on the object is located at a closer position to the detector so that only two points, Imax and Imin, are illuminated, then the displacement from the Imax point proceeding toward the Imin of the point corresponding to the centroid of illumination is given by:

$$dxpeak = xmax - \frac{(2xmax - L)}{\left(1 + \frac{Imin}{Imax}\right)}$$

where xmax is the distance from the origin to the most intensely illuminated sensor portion. This formula can be applied recursively to improve the accuracy of the spot location for use in the triangulation calculation.

In the proximity ranging mode of the present invention, it is not necessary to use a detector with discrete light receptors, such as a CCD. An alternative form of detector is a Position Sensing Detector or Position Sensing Device ("PSD") which provides the x,y values for the centroid of a spot of light falling on its surface. PSD devices are sold by Hamamatsu Photonics k.k. under the designations 10 PSD and 20 PSD. With a PSD device, there is no need for the critical alignment of light pathways with discrete receptor elements, as found in a CCD detector.

A PSD device can also be used in an imaging system by adding to it a shuttering mechanism which will limit the light reaching its surface to a single spot, which spot is moved over the PSD light sensing surface in a raster-like manner. A liquid crystal screen based on the principles employed for use in overhead projectors is suited to carry-out this function.

It is because the detector may operate on the basis of a variety of detection methods that reference is made herein to the reception of light at "light sensor regions" that are aligned with the end of associated light pathways.

Spatial Separation of Ranging Beams

The angled light of the ranging beams can proceed in several directions over the sensor array, for example north, south, east and west relative to the plane of the sensor surface. To correlate individual spots of light formed on an object each with their beam-forming source such sources may be aligned spatially with a given or allocated set or row of light pathways, providing a beam that lies in the viewing plane of such row of light pathways. As a further feature, the angular orientation of consecutive sources may vary to provide range-finding illumination at differing heights over the field of view of the sensor array. This will allow the array to provide proximity measurements over a series of differing ranges.

By arranging multiple or collectively illuminated, beam-forming pathways in a specific geometry pattern eg, within a plane so as to form a straight line of illuminating spots on a planar viewed surface, the detected pattern of spots of illumination on a viewed object can be analyzed to determine the surface profile of the viewed object and thereby its orientation. If light is emitted at specific angles from multiple rows of sources mounted along, for example, the four edges of a rectangular detector array so that it is aimed over the sensors, each row of beams will create a corresponding trace of illuminated spots on the viewed object. Each row will then provide a line of proximity information. Collectively, this arrangement will therefore provide multiple distance readings across the surface of the viewed object, facilitating the determination of its orientation.

Time Multiplexing of Ranging Illumination

In cases where a viewed object is beyond the focal length of the system or ranging beams pass above more than one receptor, multiple light receptors may detect light originating from a single ranging source. The confusion that this may create can be addressed through use of time multiplexing.

By providing separate illumination sources for each of multiple classes of beam-forming light sources, the emission of light between such classes can be time multiplexed. By analyzing the timing of detected illuminated spots on the viewed object, the sources of illumination can be sorted out and the surface profile and orientation of the viewed object can be better distinguished.

Color Separation of Ranging Illumination

Overlapping illumination by several classes of beam-forming light pathways can also be distinguished by providing distinctive color filters for each class of pathways. Thus, for example, adjacent beam-forming sources whose fields of vision are likely to overlap may be chosen to emit light of differing colors. The respective illumination spots from each color class of illuminating beams can then be detected by color-sensitive light sensors. A monochromatic CCD array can be used in this application by placing appropriate filters in the form of a color filter array in the paths of the light-receiving pathways to separately detect the colored spots of illumination appearing on the viewed object.

Viewing with Multiple Classes of Light Pathways

A feature of the invention is that it allows for providing a mask that has the capacity for viewing a scene through light-transmitting pathways of at least two classes, the pathways of each respective class being non-parallel in alignment to the pathways of the other class. Preferably, one class of pathways is oriented perpendicularly to the light detecting surface and the other class of pathways is oriented in a direction that is aligned off of the perpendicular. Alternately, both classes of pathways may be oriented non-perpendicularly to the light detecting surface. The angular divergence between the two classes of pathways will determine the effective range of this optical system when used as a proximity detector based on stereopsis techniques.

Stereoscopic Viewing

With multiple classes of pathways present, a stereoscopic equivalent optical evaluation of the viewed scene can be effected. The extraction of proximity information or stereo images from dual images obtained from displaced locations is a well established procedure. See "Computer Vision" by Dana H. Ballard and Christopher M. Brown, Prentice Hall 1982 section 3.4, pp 88–93.

An equivalent result can be obtained by comparison of two images arriving from different directions at, effectively, a nearly single location.

By a comparison of the pixel array patterns developed on the light-sensing surface illuminated by two classes of light pathways that have differently angled but overlapping fields of view, the degree of displacement between such patterns can be taken as a measure of the distance to the viewed object. The computational analysis needed to effect this assessment can take into account the presence of a three dimensional surface on the viewed object by identifying prominent features through the combination of edges that are related to such features. A three dimensional object representation may also be obtained.

Peripheral Viewing

A further embodiment incorporating multiple classes of light pathways is a detector having a peripheral vision capacity. In such a case a selected series of light-pathways may be progressively splayed outwardly in their orientation, to be directed laterally. Thus, for example, each light transmitting pathway in such a line may be rotated by some angular amount (say 5 degrees) from the orientation of the adjacent pathway. This results in the collimating pathways being splayed in their orientation, with each detector seeing light from a specific acceptance cone that is rotated with respect to that of adjacent detectors. Complete coverage of all angles from 0 to some upper maximum, e.g. 45 degrees, can be obtained. Thus, the invention can identify objects present over a wider field of view than the field of view provided directly above the light sensing array.

While having less acuity due to the inherent increased separation of the fields of view associated with such outwardly-directed light pathways, these laterally directed light pathways can still provide the important benefit of at least detecting the presence of objects that are peripheral to the principal field of view. For this purpose, peripheral light pathways may be provided with increased fields of view by having outwardly expanding viewing field boundaries. Thus, for example, such pathways in a solid mask may be formed as conically shaped holes.

Multi-layer Mask

A key element of this invention is the occluding mask through which light pathways of high aspect ratios have been formed. Preferably, such pathways have a diameter which is on the order of the width of the individual light sensing areas present on the highest density light detector available, thereby providing a high pixel density of the viewed scene. This dimension is presently on the order of 20 microns for normal CCD detectors. For holes with an aspect ratio of 15 to 1, the corresponding length of the light pathway would then be 300 microns. Using laser ablations of material from an opaque mask material, such as polypropylene or steel, it has been found difficult to produce clean pathways of such a small diameter having a substantial aspect ratio.

Accordingly, a further feature of the invention is the formation of a multi-layer mask that performs equivalently to a solid mask having high aspect ratio pathways formed therein. This multi-layer mask is provided with two or more multiple, separated layers of opaque or illumination occluding and preferably non-reflecting, sheeting that have cleanly prepared holes positioned in register with each other to perform equivalently to a thicker solid sheet. In such thinner sheets, holes of the requisite minimal diameter may more easily be formed.

Multiple Thick Layers

Where multiple layers are provided of sheets of a constant thickness t, it has been found that the consecutive layers beneath the top layer of the mask may be optionally spaced apart by gaps or spacings S that follow a formula for their width of:

$$S_n = [(L/D)^n - 1] \cdot t$$

In such a case, the multi-layer layers will provide an equivalent total mask thickness of:

$$T\mathit{eff} = [(L/D)^{n+1} - 1] \cdot t/(L/D - 1)$$

where:
  Teff is the effective thickness of the multi-layer mask from the top of the first layer to the bottom of the bottom layer
  t is the thickness of each individual layer
  n is the count of spaces present between layers
  n+1 is the total number of layers present
  D is the diameter of the holes in each mask layer
  L is the hole-to-hole separation, or interval within the mask layers.

In the above formula, the surface of the light receptor may be counted as being one occluding layer. This is because, apart from refractive effects, a system having an occluding layer placed directly over the surface of the detector would perform equivalently if such layer were not present. When refractive effects arise for light exiting the last masking layer, the last spacing between this layer and the light sensing surface may have to be reduced to minimize the impact of such refractive effects. This, in turn, will reduce the value of Teff.

The spacing gaps in such a multi-layer mask can be occupied by air. Alternately, to preclude occlusion of holes by dirt, such gaps may be occupied by a transparent solid which also serves as a spacer. Suitable spacers for occupying the gap are polycarbonate or polyethylene plastics.

Spacers may also be in the form of a solid perforated with holes that align with the light pathways. Such spacer material need not have holes of the same aspect ratio as those of the light pathways. Lower aspect ratio holes may be readily cut through the spacer layers even though they are of increased thickness. Such holes may even encompass more than one light pathway.

The aspect ratio of the light pathways in such a multi-layer mask is the ratio of the total effective thickness of the mask to the diameter of each hole, vis Teff/D. It is an objective of this invention to maximize this parameter in conjunction with providing a high density of light pathways e.g., a small value for the hole-to-hole interval L.

By assembling a multi-layer mask of individual sheets, each of the thickness "t" according to this geometry, the equivalent to a thick, solid mask containing high aspect ratio pathways can be produced using a series of thinner sheets pierced by holes of a much smaller aspect ratio. The formula provided maximises the equivalent thickness of the multi-layer mask while preventing any cross-illuminations from occurring between adjacent light pathways.

Multi-layer masks can be provided in which individual layers are spaced more closely together. In such cases the effective aspect ratio of the multi-layer mask will fall more rapidly than its actual thickness. But at least a portion of the benefits of the optimal arrangement will arise when the spacings between masking layers increase progressively when proceeding towards the light detector surface. This formula is also applicable for angled holes providing that the light pathways of the holes of one class do not intersect those of another class.

The above structure works for light passing in one direction (top to bottom only). However, if the multi-layer mask is used to both receive reflected light from the object and direct light beams onto an object, then it must be bidirectional. A bidirectional multi-layer mask, which works equally well to parallelize light passing in both directions, is preferably symmetrical about its central plane, with either regular spacings between layers, or with larger spacings between the central layers. A bidirectional multi-layer mask may be created by sandwiching two mask halves, each based on an individual layer of thickness t. The first mask half, of order n and effective thickness T(n) is oriented for accepting reflected light from the top and directing it to the sensors; the second mask half is of order n−1 and effective thickness T(n−1) is oriented for admitting a light source at the bottom and directing the light to an object above the mask. The mask halves, combined as a sandwich, form a multi-layer bidirectional mask with both top T(n) and bottom T(n−1) portions. The effective thickness of such a bidirectional mask would then be:

$$T(\text{bidirectional}) = T(n) + T(n-1) - t$$

Use of Thin Layers

The earlier of the above formulae apply in the case of multiple sheets each of a thickness "t". It is not essential, however, for all such sheets to have a substantial thickness. If the first layer only has a given thickness "t", then subsequent light-blocking layers of virtually zero thickness may be employed. Such subsequent layers or occluding sheets can, therefore, be in the form of thin films deposited on transparent spacers using, for example, standard photolithographic techniques.

The preferred, optimal spacing S for positioning opaque thin films beneath a first mask layer of substantial thickness "t" is given by the formula:

$$S_n = (L/D)^{n-1}(L/D-1) \cdot t$$

and the multi-layer layers will provide a total effective mask thickness of:

$$T_{\text{eff}} = (L/D)^n \cdot t$$

wherein:

Teff is the total effective thickness of the structure with n spaces from the top of the first layer to the bottom of the bottom sheet t is the thickness of the first, uppermost layer, the layers or sheets below being of negligible thickness n is the count of spaces between the sheets S(n) is the separation between mask top layer and subsequent sheets for the nth spacing D is the diameter of the holes in each mask sheet L is the hole-to-hole separation in each sheet.

The resulting total effective thickness accordingly scales linearly with the thickness of the first layer, and as a power of the ratio of the hole interval to hole diameter.

Specific Applications

Fingerprint Reader

An application for such a vision sensor based on the invention is the viewing at close range of an object having fine details or texture on its surface, such as a finger with its fingerprint pattern. By providing a high density of high aspect ratio light pathways and a high density of pixels, a high resolution image can be formed of a closely proximate surface, such as a fingerprint.

Robotic Manipulator Proximity Detector

Another application for the invention is as a proximity detector located on the grasping surface of a robotic manipulator. Due to the absence of refractive lens optics, the optical detection system of the invention can be sufficiently robust to transmit significant compressive and shear loads. This makes it especially suited to being positioned on the actual grasping surface of a robotic end effector. Further, the ability of the invention to continue to function as a proximity detector while the distance to the object being grasped closes to zero will permit more precise control over closing speeds and grasping forces.

The foregoing summarizes the principal features of the invention and some of its optional aspects. The invention may be further understood by the description of the preferred embodiments, in conjunction with the drawings, which now follow.

DESCRIPTION OF THE PREFERRED EMBODIMENT

Figure 1:
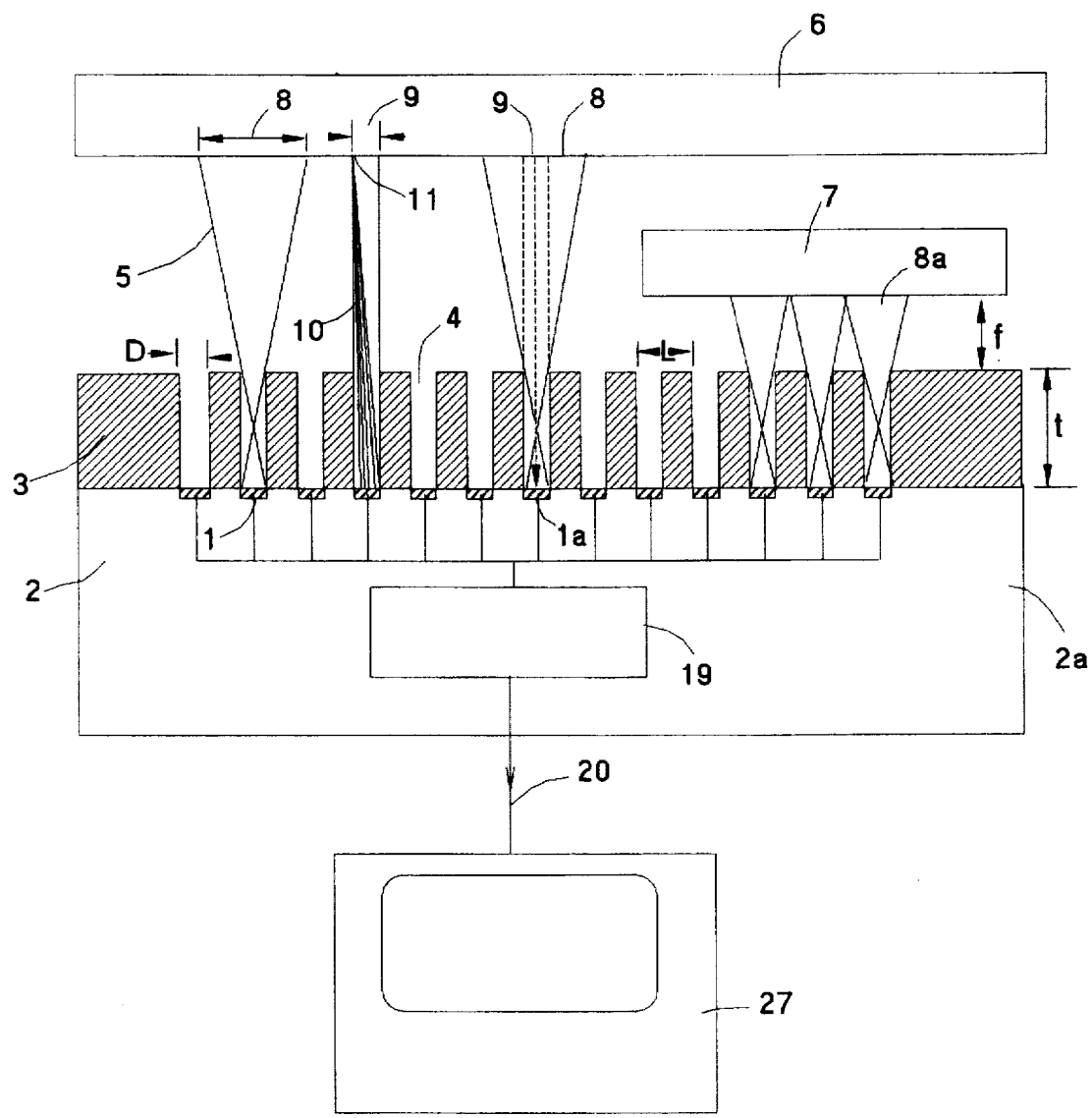
FIG. 1 is a pictorial cross-sectional depiction of a side view of the vision system of the invention viewing two different objects at close range.

In FIG. 1 a basic vision system is depicted in which an array of light sensors 1 on a substrate 2 constitute a detector 2a. Mounted directly over the detector 2a is a mask 3. The mask 3 has a series of holes, or parallel light pathways 4, having an aspect ratio defined by their depth and width, which corresponds to the mask's thickness (t), divided by their diameter (D). These holes are distributed at intervals (L) across the mask.

Each light sensor 1 has a conical field of view 5 defined by the aspect ratio of the light pathways 4. Up to a specific object distance (f) (representing a "working-distance" length for the system) the conical fields of view 5 and viewed areas 8a of each sensor 1 do not overlap. Beyond that working-distance f, the viewed areas 8 overlap. Up to this point of overlap, and within a marginally more extended range, a visual representation of a viewed object 6,7 can be obtained directly by reading-out the brightness values provided by the light sensors 1 to provide pixels for generating an image. The image can be presented on a CRT 27 as shown in FIG. 1.

In FIG. 1 two objects 6, 7 are shown, the latter being closer to the mask 3 and at the working-length f. Using object 6 for demonstration, the total viewed area 8 illuminating a sensor 1 has a central region 9 that provides a direct source of light striking the sensor 1 through the multiple rays 10 emanating from each point 11 within this central region 9. Outside the central region 9 the balance of the viewed area 8 provides a halo of illumination to the sensor 1 that varies with the length of the object from the sensor 1.

When the viewed object is very close to the sensor array, each sensor receives light that is analogous to a "contact print" as prepared for photographs.

For high aspect ratio holes e.g. 5:1, 10:1 and more, the illumination of a given sensor 1 essentially corresponds to the illumination leaving the viewed area 8 in the direction of the sensor 1, without bring reduced by the normal, inverse square law since the light rays are substantially parallel. In such cases, the vision sensor of the invention operates with constant sensitivity, irrespective of the distance to the viewed object.

Furthermore, since no refractive elements need be present in the light path, none of the problems such as geometric distortion or chromatic aberrations customarily associated with lenses will necessarily occur. Additionally, since no refractive elements are required, the full spectrum of light from ultra-violet to far infra-red is provided to the sensors, unimpeded by unwanted absorption in glass lenses, for example. Optionally non-lensing refractive elements may be present, as in the form of a transparent protective cover. In either case, there are no depth-of-field limitations on focusing in the customary sense. In fact, no focusing adjustments are required at all.

Object 7, being closer to the sensor 1, is depicted as being at the working distance limit f whereat viewed areas 8a on the object 7 commence to overlap. For a more distant object 6, the viewing of overlapping viewed areas 8 may be avoided by selecting signals from a spaced sensor 1a at the expense of loss of accuracy or acuity of the system. Alternately, signal processing techniques can be used to "deblur" partially overlapping pixel fields of view 8.

In FIG. 1 the sensors 1 are polled for their light-value measurements by circuitry symbolized by the processor 19 to produce an output 20. Processor 19 may be optionally embedded in substrate 2 as shown in FIG. 1, or may be external to the sensor system. This output 20 represents a series of values corresponding to pixel-values established by the sensors 1 of the detector. While not shown in all Figures, such processing is intended to be present in each system depicted.

Figure 2:
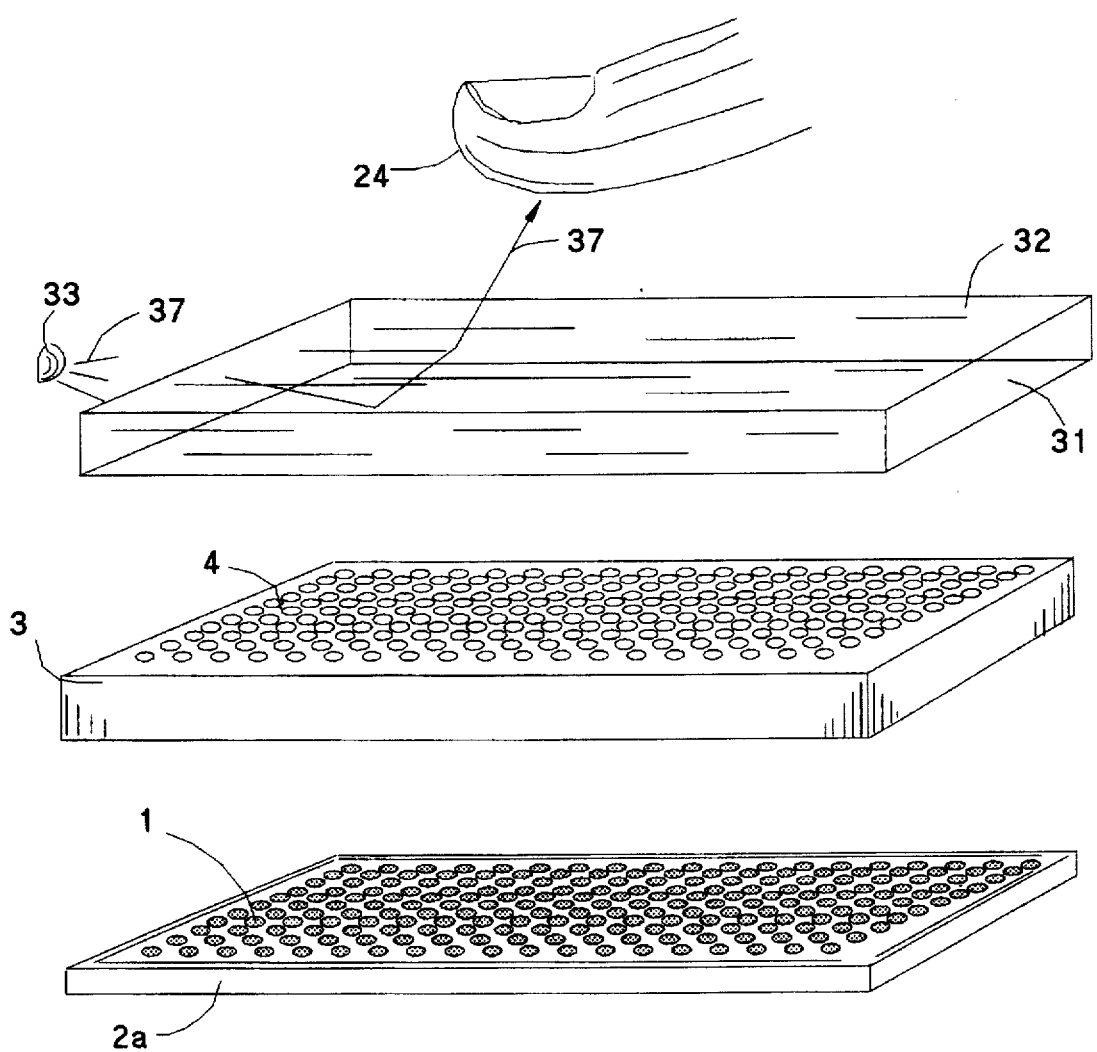
FIG. 2 is a pictorial, exploded depiction of the imaging system of the invention viewing a finger to determine a fingerprint pattern.

In FIG. 2 the components for viewing a finger 24 in order to identify a fingerprint are shown. As well as the photo detector array of sensors 1 and mask 3, a transparent cover 31 is provided to keep the holes 4 clean and free of obstructions. Additionally, this cover 31 provides a surface 32 that precisely positions above the mask the fingerprint surface that is to be imaged.

Figure 3:
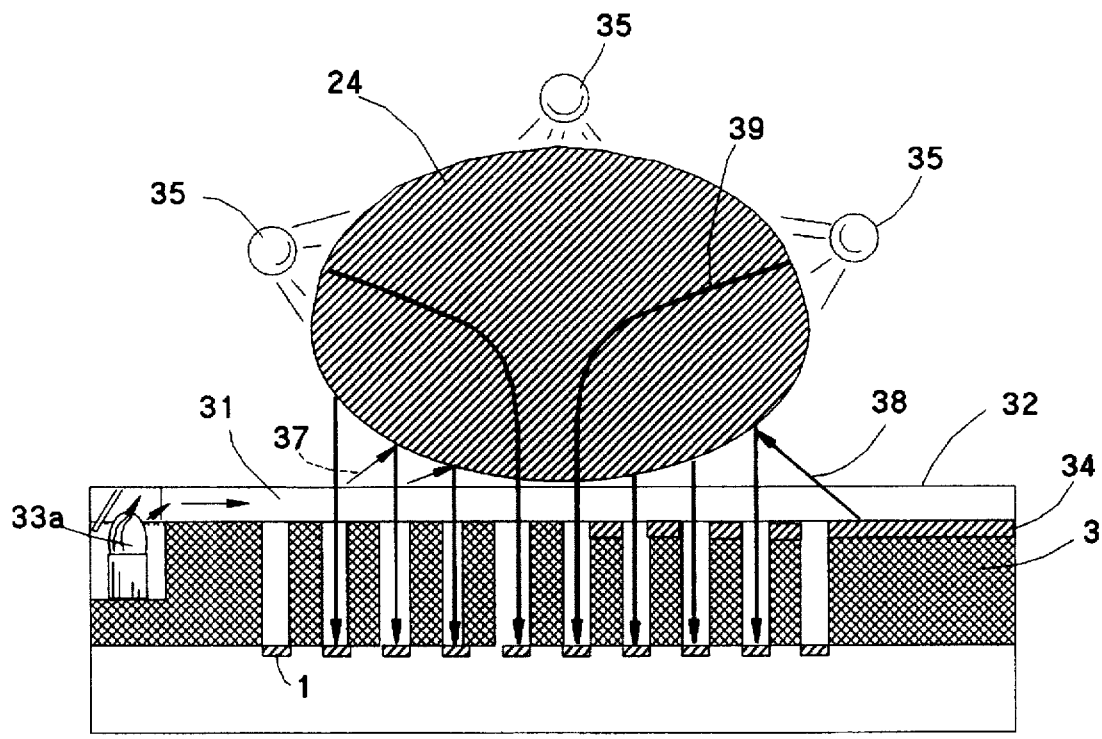
FIG. 3 shows a fingerprint reader having a variety of alternate illumination sources depicted.

Illumination may be introduced laterally from one or more light sources 33 mounted about the reader. As shown in FIG. 3 a light guide source 33a may introduce light into the interior of the transparent cover 31 which will distribute the light through internal reflection. Some of this light 37 will be scattered to illuminate the finger 24 and be viewed by the sensors 1.

An electroluminescent panel 34 may also be formed on the top surface of the shadow mask 3 to provide direct illumination 38 of the finger 24.

For a translucent object indirect illumination 39 may be provided from a rearward source or sources 35, preferably in the form of a red or a near infra-red light source in the case of a fingerprint reader, that allows light 39 to travel through the finger 24 to reach the surface 32 where the print pattern can be viewed.

Figure 4:
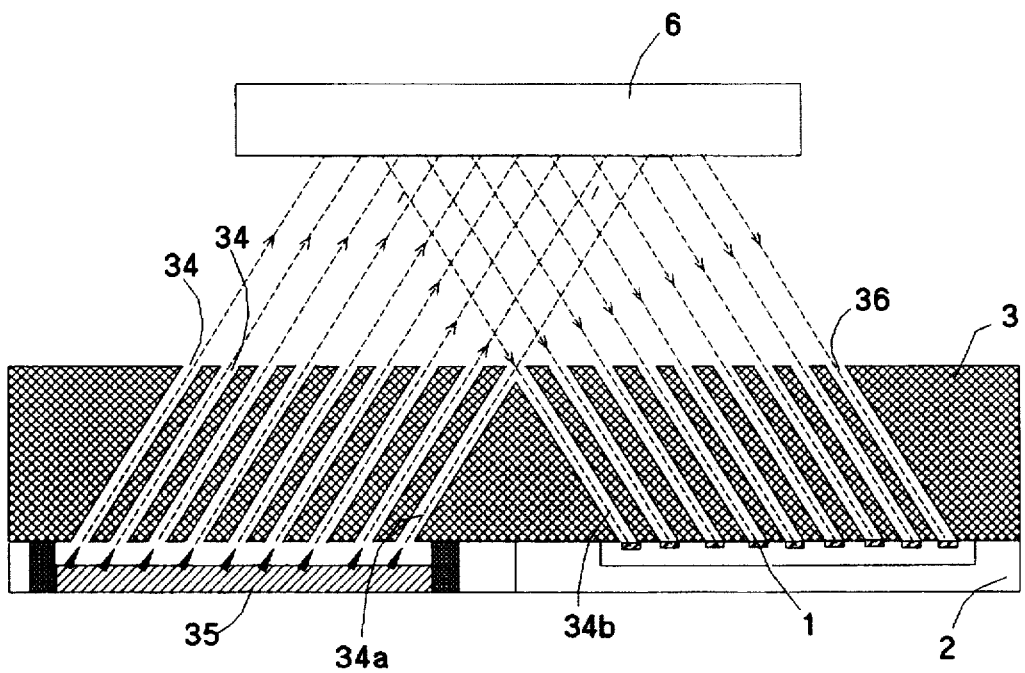
FIG. 4 shows a cross-section of a light detector having both light receiving pathways and illumination pathways shown in separate regions within the same mask.

In FIG. 4 a portion 34 of the passageways in the mask 3 extend to a light source 35 located in the substrate 2 of the detector to function as illuminating light pathways 34. This light source 35 may be an expanded beam of laser light or other convenient source. The illuminating light pathways 34 may interpenetrate or be interleaved with the light receiving pathways 36 that provide each sensor 1 with illumination. FIG. 4 omits depicting such interleaving for clarity. The intersection of light pathways 34a, 34b suggests how this can be arranged. In this manner the surface of the object 6 may be illuminated even when the mask 3 is positioned closely to the viewed area.

Figure 5:
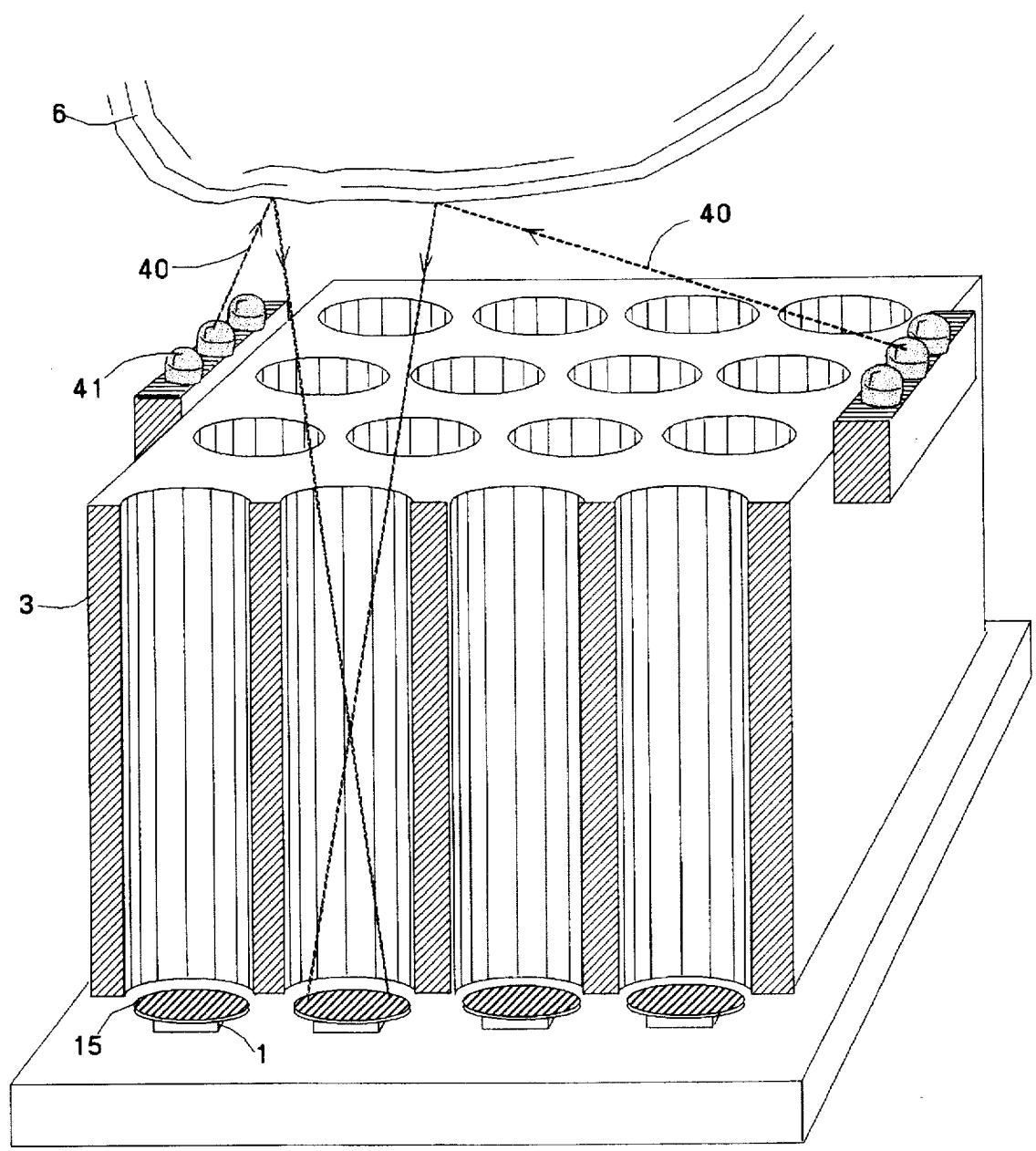
FIG. 5 shows an object illuminated by white light sources with a color filters positioned over the light sensors.

In FIG. 5 an object 6 is shown illuminated by white light 40 from white light sources 41 mounted along the periphery of the mask 3. Color filters 15, preferably in an alternating pattern of red, green and blue filters or their complements (not necessarily in balanced ratios or a specific pattern) cover the sensors 1. The output from such a system may then be processed to produce a color video image.

Figure 6:
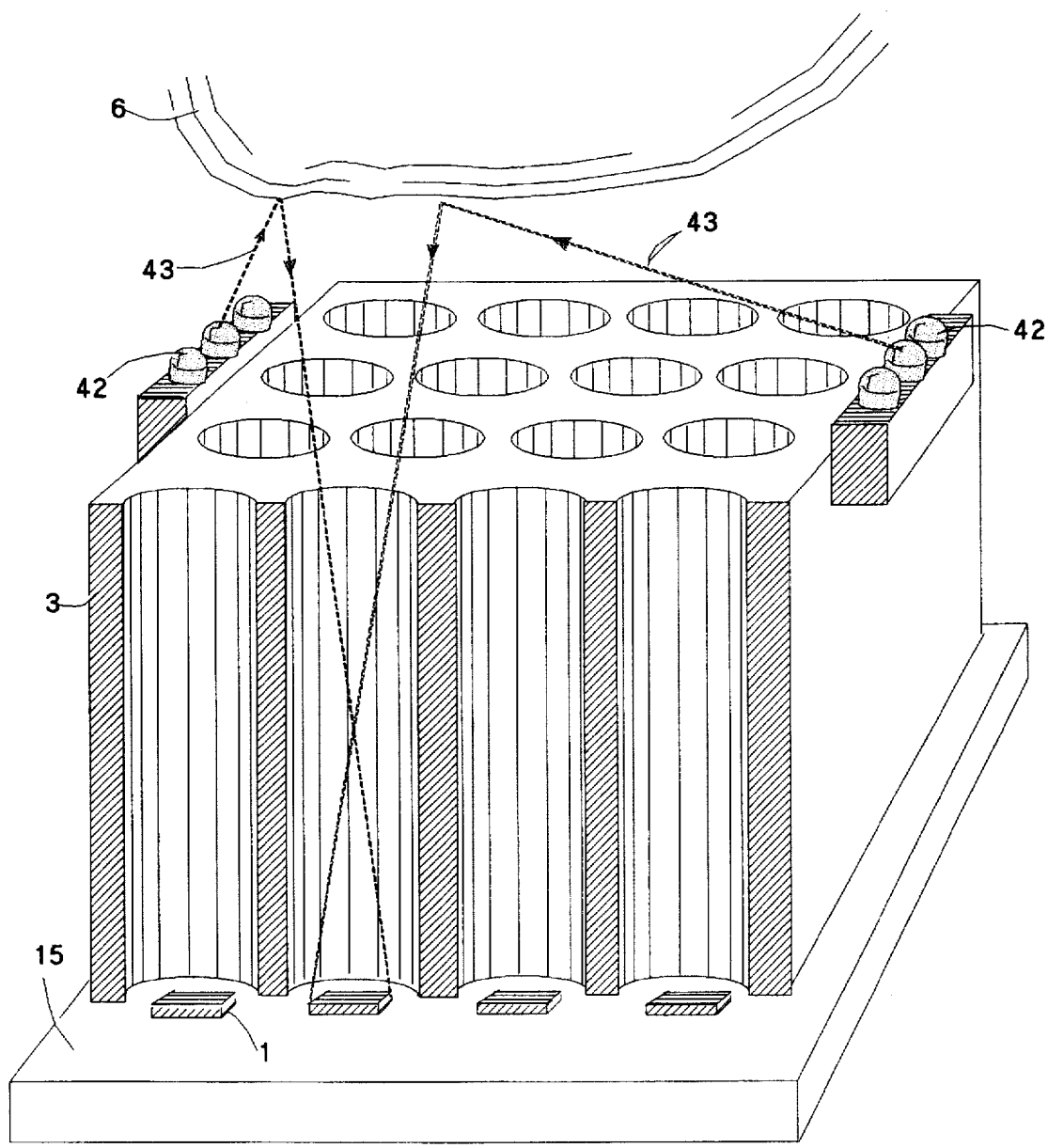
FIG. 6 shows an object exposed to sequentially activated sources of light of differing colors.

In FIG. 6 the peripheral light sources 42 are of alternating colors, such as red, green and blue. These sources of colored light are turned-on alternately, flooding the object 6 consecutively with different colors of light. The output signals from the sensors 1 may then be synchronized with the illumination to provide separate images of the object 6 in each respective color. These images may then be combined, as in a high level imaging processor 26, to produce a color image on a CRT 27 (shown in FIG. 12).

In the foregoing examples, the light detector has consisted of discrete sensors 1 as are found on CCD systems. An alternate detector arrangement employing a Position Sensing Device is shown in FIG. 6a.

Figure 6A:
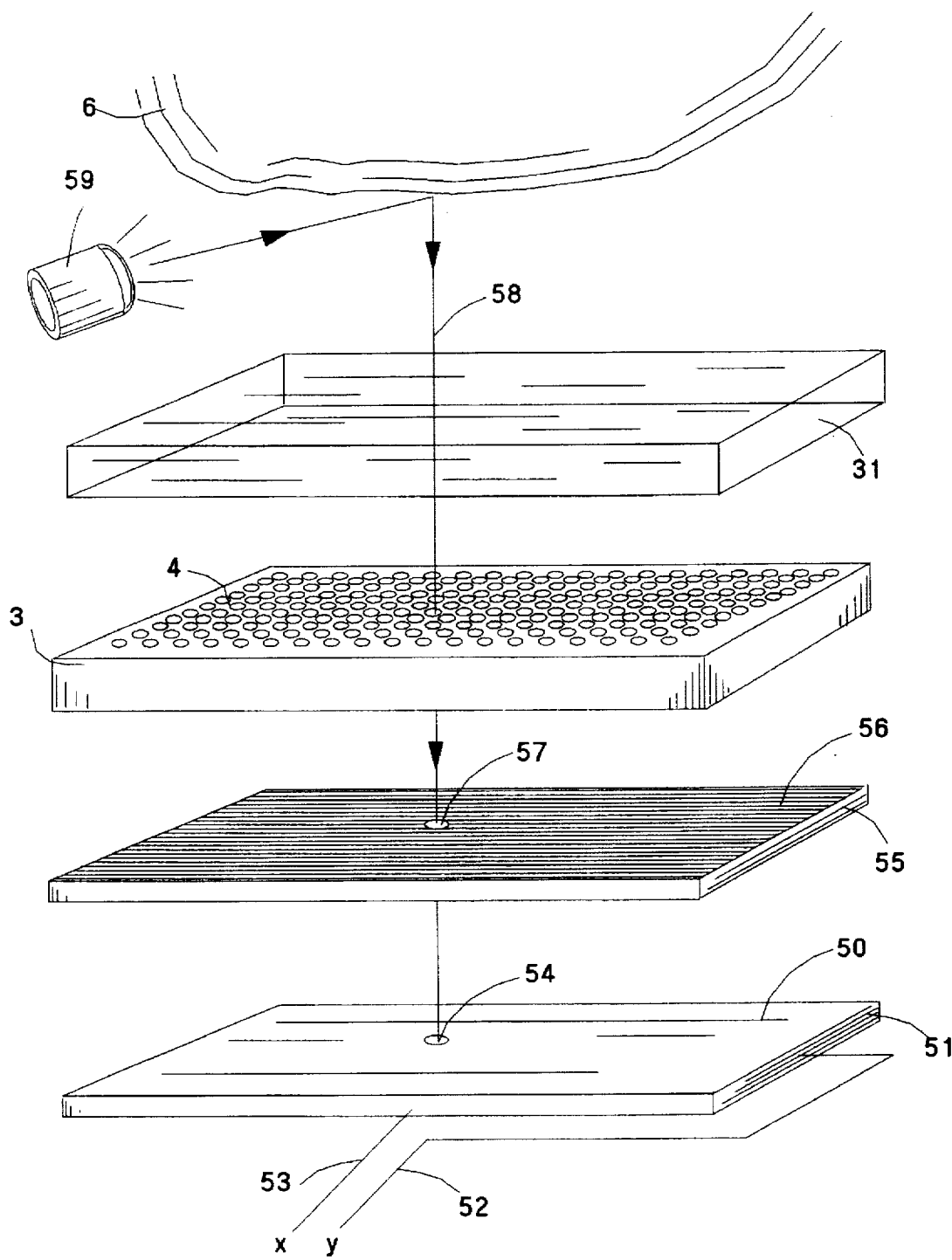
FIG. 6A is a pictorial, exploded depiction of the imaging system of the invention based upon a Position Sensing Device and a modified Liquid Crystal Display (LCD) shutter cross-section of a finger top above.

In FIG. 6a, as in FIG. 2, a transparent cover 31 and mask 3 are present. The array of sensors 1 is, however, replaced by the surface 50 of a PSD 51. From the PSD 51 lead two outputs 52, 53 that provide x and y co-ordinate values and light intensity for a spot of light 54 illuminating the surface 50.

Above the PSD 51 is positioned a shuttering mechanism 55, preferably based upon liquid crystal technology. The shutter 55 is opaque over virtually all of its surface 56 except for an aperture portion 57 which serves as a viewing window. This aperture 57 is aligned with the illuminated spot 54 to allow light 58 from a source 59 to pass through the mask 3 and strike the PSD surface 50.

Figure 12:
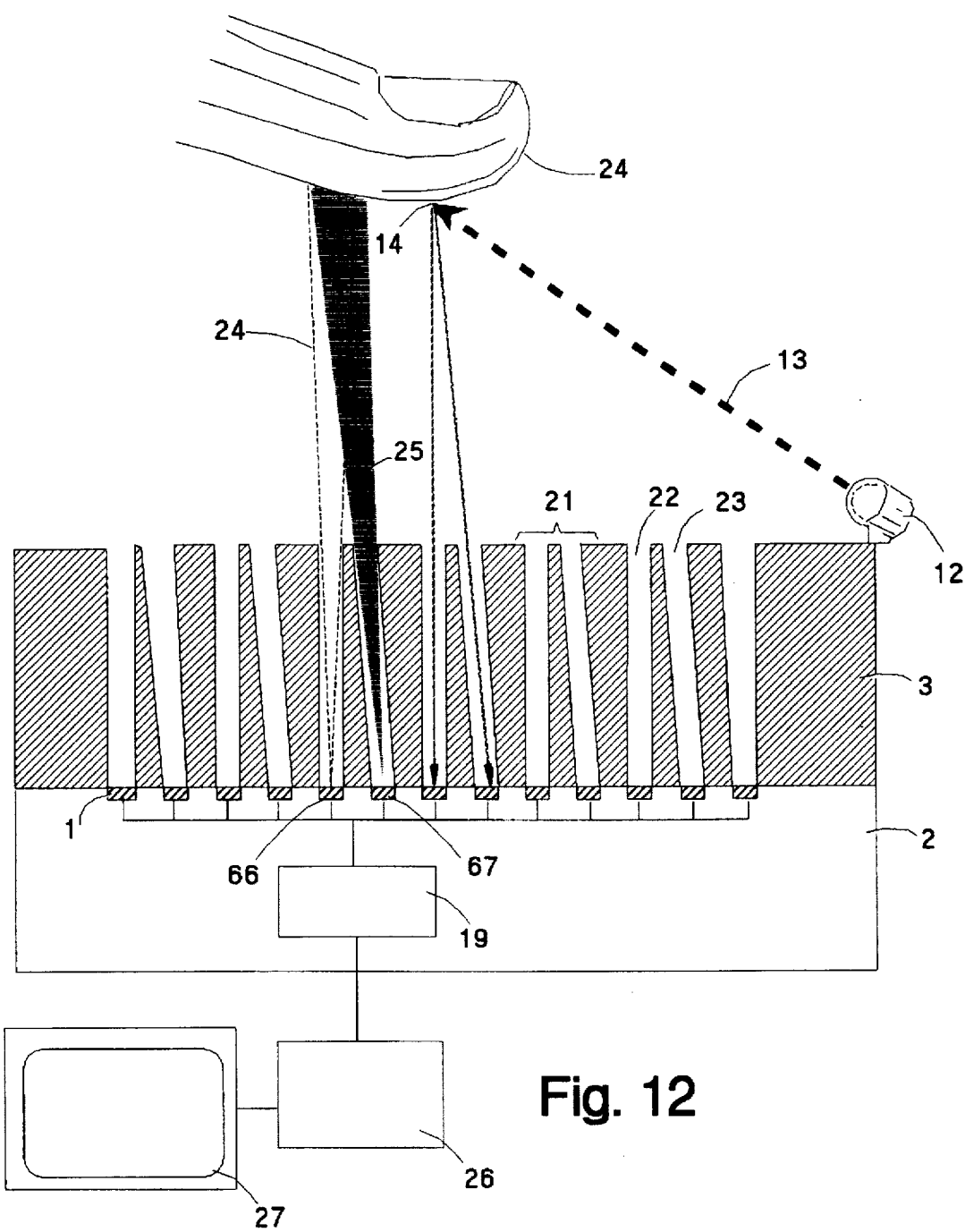
FIG. 12 shows a shadow mask with two classes of interleaved light pathways for stereo viewing of a finger tip pattern.

By controlling the position of the aperture 57 within the shutter 55, the PSD 51 can be caused to provide consecutive x, y values of the light arriving at the PSD across the entire PSD surface 50. These output signals may then be fed to an imaging processor 26 and fed to a CRT 27, or other imaging device, as shown in FIG. 12. Alternately, they may be fed to a ranging processor to provide output proximity values.

Hereafter, and throughout, when reference is made to light sensors, light receptors and the like within a detector, such references are intended to extend when appropriate to include the equivalent illuminated spot 54 of a system as depicted in FIG. 6a.

Figure 7:
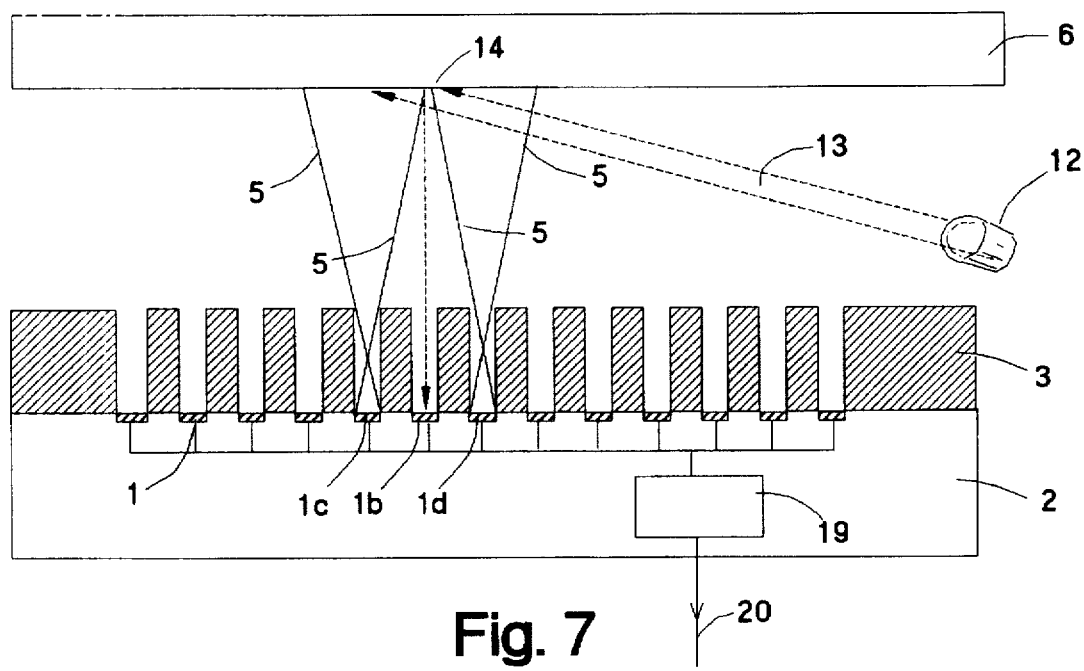
FIG. 7 shows the detection of a light spot illuminated by a triangulating beam of light as viewed by several sensors in the detector array.

As shown in FIG. 7 the array of light sensor's 1 can measure proximity by providing a triangulated light source 12, such as semiconductor lasers which produce a narrow beam of light, that will provide a narrow beam 13 of light at a known, fixed angle to illuminate a discrete spot 14 on an object 6. When the light sensors 1b, 1c, 1d, whose respective fields of view 5 include this spot 14, provide output signals for detected illumination, the geometry between the most activated sensor 1b, the light source 12 and the angle of the beam 13 can be used in the normal manner to determine the distance to the object 6.

Figure 8:
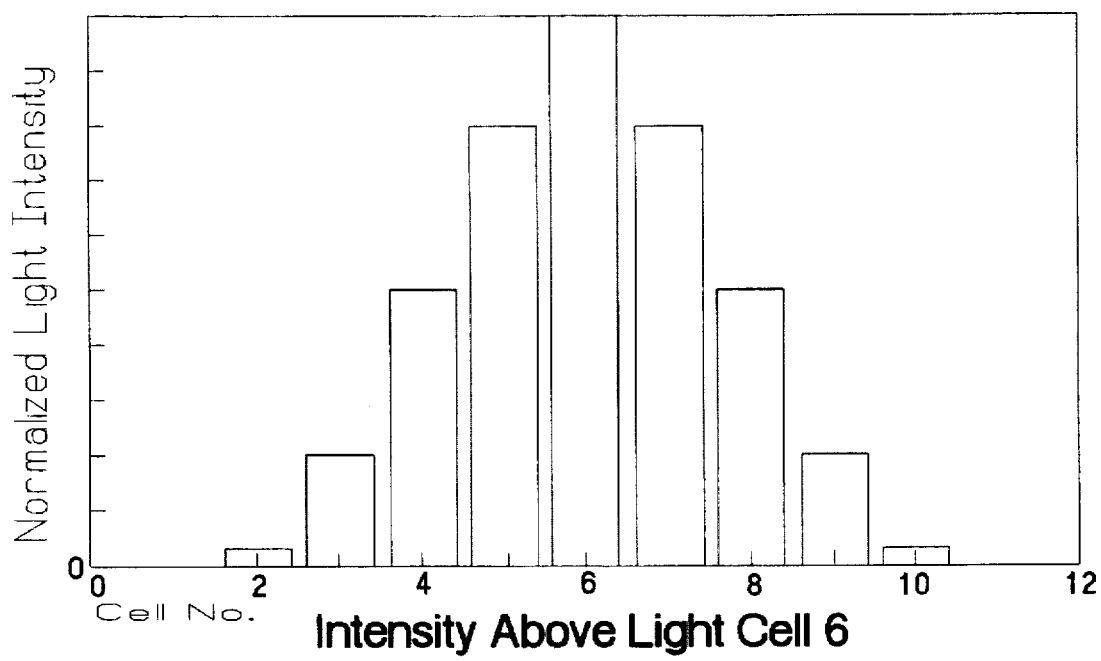
FIG. 8 shows a graph of the intensity of illumination of a series of sensors arising from a single spot from which the sensor with the peak signal may be identified.

In FIG. 7 the laser beam 13 is scattered off a spot 14 at the surface of the object 6 and the sensor 1b with the brightest value determines the location of the spot 14. By knowing the position of this most illuminated sensor 1 the distance to the object can be calculated from the known angle of the beam 13. FIG. 8 shows an example of the relative degree of illumination of the sensors 1 beneath a spot of light on an object located eight sensor intervals above the sensors with light pathways having an aspect ratio of two. The relative degree of illumination of the sensors 1 as shown in FIG. 8 may also be asymmetrical if the spot 14 in FIG. 7 is not directly above sensor 1b. However, the location of spot 14 above the sensors 1 can still be determined by interpolation of the brightness values of FIG. 8.

Figure 8A:
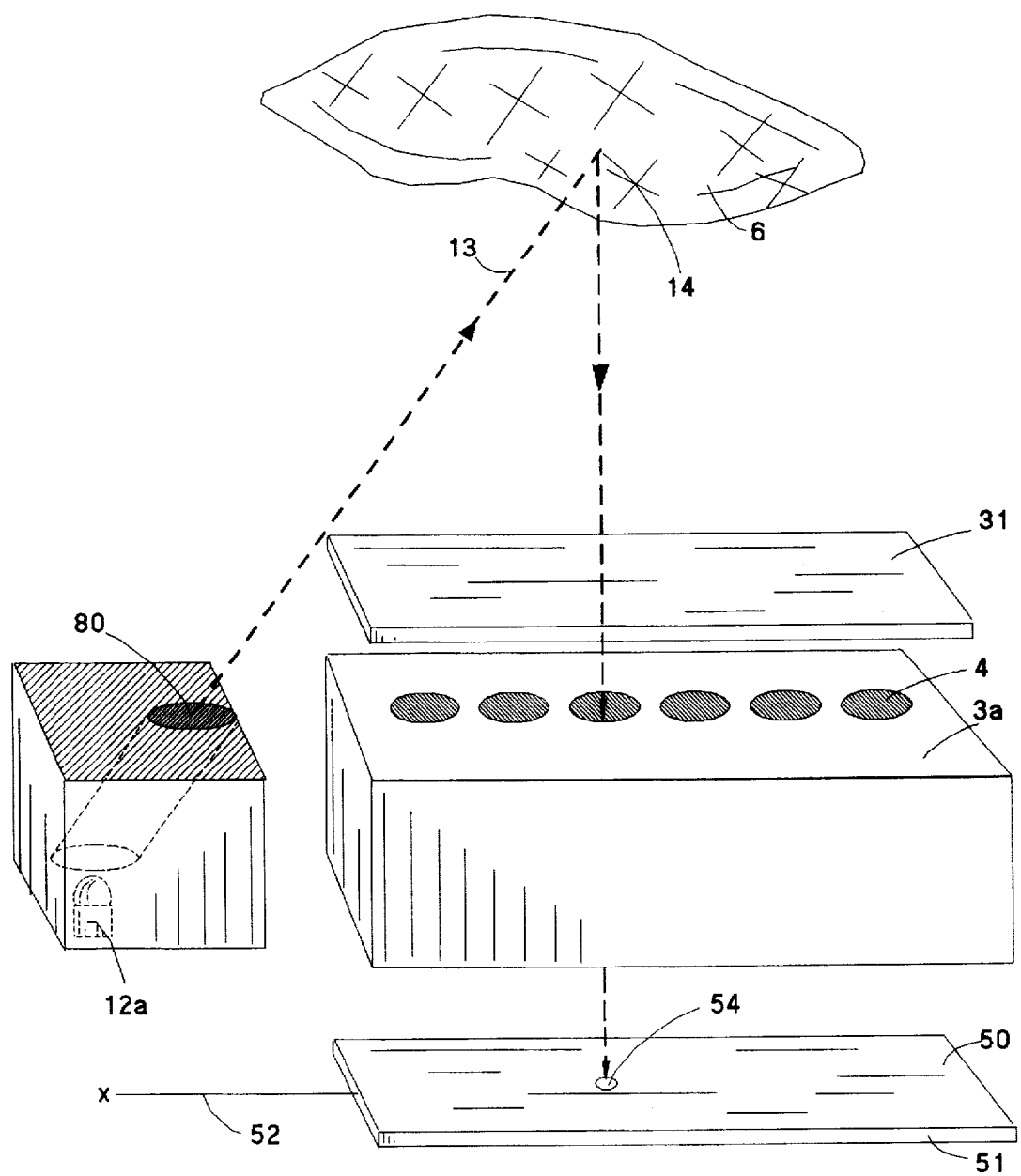
FIG. 8A shows a linear array mask used in conjunction with a Position Sensing Device as the light detector.

A basic range-finding system can be created as shown in FIG. 8a wherein a Position Sensing Device (PSD) 51 is located beneath a linear array of apertures 4 in a mask 3a. Light from a lateral source 12a passes through a beam-forming pathway 80 to provide a beam 13 to illuminate an object 6. A cover 31 protects the apertures 4.

Through basic geometry, knowing the angle of the beam 13, the location of the source 12a and the location of the center of illumination 54 on the PSD detector surface 50 the distance from such surface 50 to the object 6 can be calculated. Where the spot of illumination 14 on the object 6 is viewed by multiple light sensing regions on the detector surface, the point on the line of receptors corresponding to the location of the centroid of that spot 14 can be interpolated by using the following formula:

$$dxpeak = \frac{L(Imid - Imin)}{2(Imax - Imin)}$$

where:

L is the interval between light pathways or mask holes

Imax is the location of the most illuminated sensor region, measured along a line of sensor regions aligned with the triangulating light source Imin is the location of the least illuminated sensor region in the sensor line Imid is the location of the intermediately illuminated sensor region in the sensor line dxpeak is the displacement along the sensor line of the point corresponding to the centroid of the spot of illumination on the viewed object, as proceeding in the direction of the Imax sensor portion to the Imid sensor portion.

To provide proximity measurements to an irregular surface, obtain a surface profile or extract the orientation of a surface, a series of ranging light sources 12 may be positioned preferably along the periphery of the sensor array. Such an arrangement is shown in FIG. 9.

Figure 9:
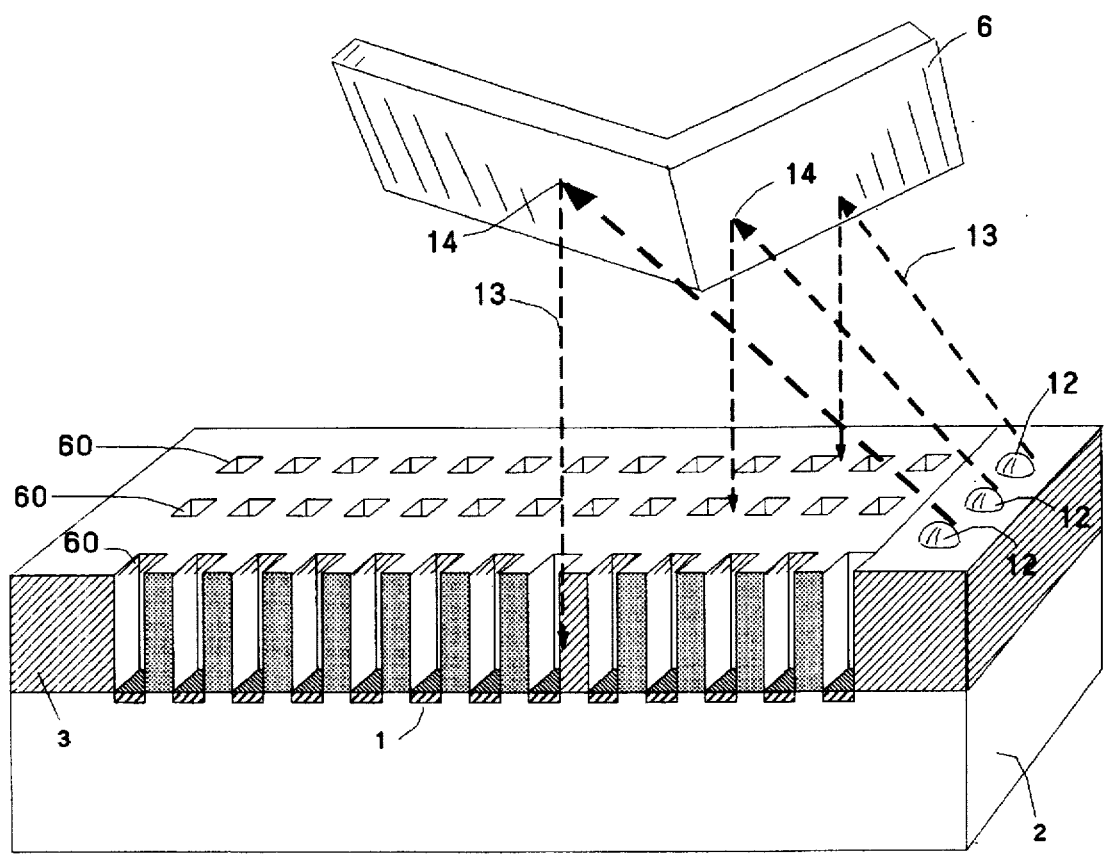
FIG. 9 shows the sensor array of FIG. 7 with multiple light sources positioned along the periphery.

In FIG. 9 multiple light sources 12 are distributed opposite rows 60 of sensors 1 so that sensors 1 in a given row 60 can only "see" a spot of illumination 14 originating from a specific sensor 12. Thus a proximity measurement for the distance to a series of spots 14 on an object 6 can be obtained by triangulation. This information can then be utilized to measure proximity and produce a profile of the viewed object 6 along the line of illuminated spots 14.

In FIG. 9 light sources 12 are rendered distinguishable by their spatial alignment, i.e. by providing non-intersecting beams 13, optionally in the form of a line of parallel beams.

Figure 10:
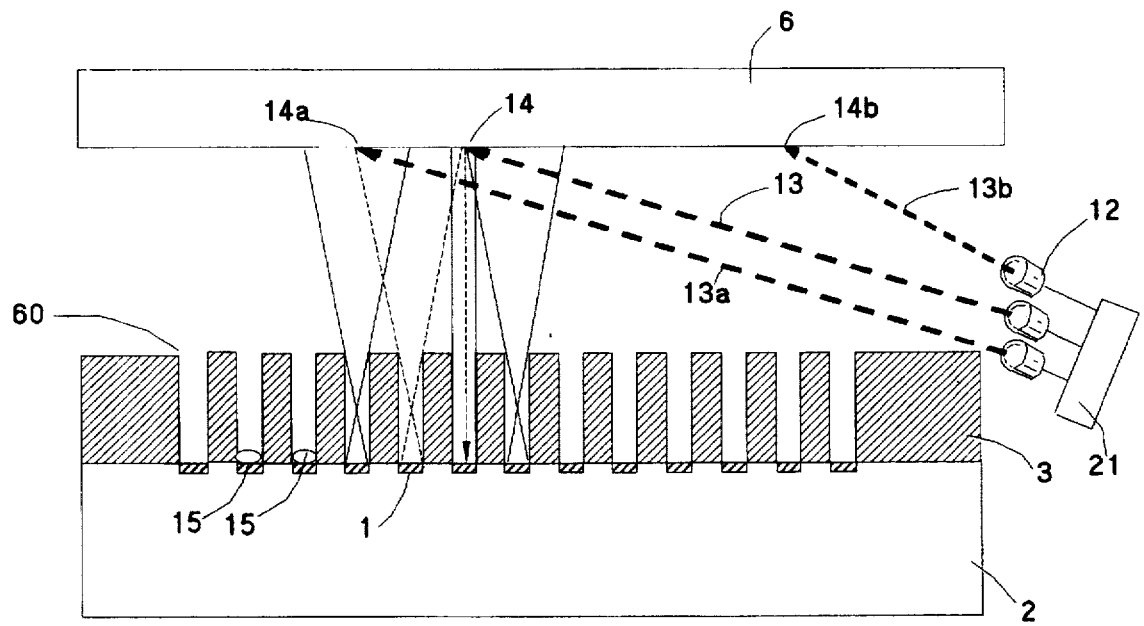
FIG. 10 shows the sensor array of FIG. 7 with multiple light sources positioned to illuminate above a common row of sensors within the array.

An arrangement for providing multiple beams 13 that can provide illumination for more than one sensor 1 and still be distinguished as to their origin is shown in FIG. 10. In this Figure, multiple beams 13, 13a, 13b aligned with each row 60 are emitted from each source 12, striking the object 6 at multiple spots of illumination 14, 14a, 14b. These beams 13, 13a, 13b may be parallel 13, 13a, or they may be angled with respect to each other 13; 13b. Because, as the height of the object 6 varies, all of these beams 13, 13a, 13b can be sensed by at least one sensor 1 in the row of sensors 60, some method of distinguishing the source of each spot of illumination 14, 14a, 14b is required. Time multiplexing of the release of the beams 13, 13a, 13b is one means by which this may be accomplished. Another means is by color separation.

By alternating the illumination of beams 13, 13a, 13b overlying a common row 60 overtime, the sources of spots 14, 14a, 14b of illumination on the object 6 may be identified and multiple measures of their distances from a single row 60 of sensors 1 can be obtained. In this manner more detailed samples of the proximity or surface profile of the object 6 may be obtained.

Figure 10A:
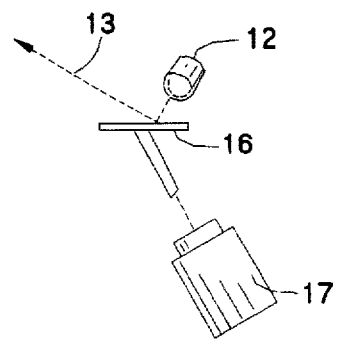
FIG. 10a is a detail of an alternate arrangement to that of FIG. 10 whereby an actuated mirror may redirect light from a single source to perform equivalently to multiple sources.

When time multiplexing is employed, overlap of the illuminated areas of the beams 13 is permitted. The processing of the outputs of light sensors 1 must be synchronized with the emission of light from the sources 12 in accordance with a light controller 21 which serves as a time multiplexing means. While multiple fixed sources 12 are shown in FIG. 10, FIG. 10a shows that a single source can perform equivalently by projecting its beam into an adjustable mirror 16, controlled by an actuator 17, that will allow the exiting beam 13 to be swept through space.

When color separation is employed, each of the overlapping beams 13, 13a, 13b as shown in FIG. 10 must be emitted in a different color. Further, the light sensors 1 may be provided with filters 15 to allow them to detect, preferentially, specific colors. Again, as with time multiplexing, the illumination of a specific spot 14 can be associated with a specific beam 13, allowing the proximity of the corresponding spot 14 to the array to be determined by triangulation independently of other spots on the object 6.

The systems of FIGS. 9 and 10 may be conveniently combined to provide a more precise identification of the surface profile of an object 6.

Figure 11:
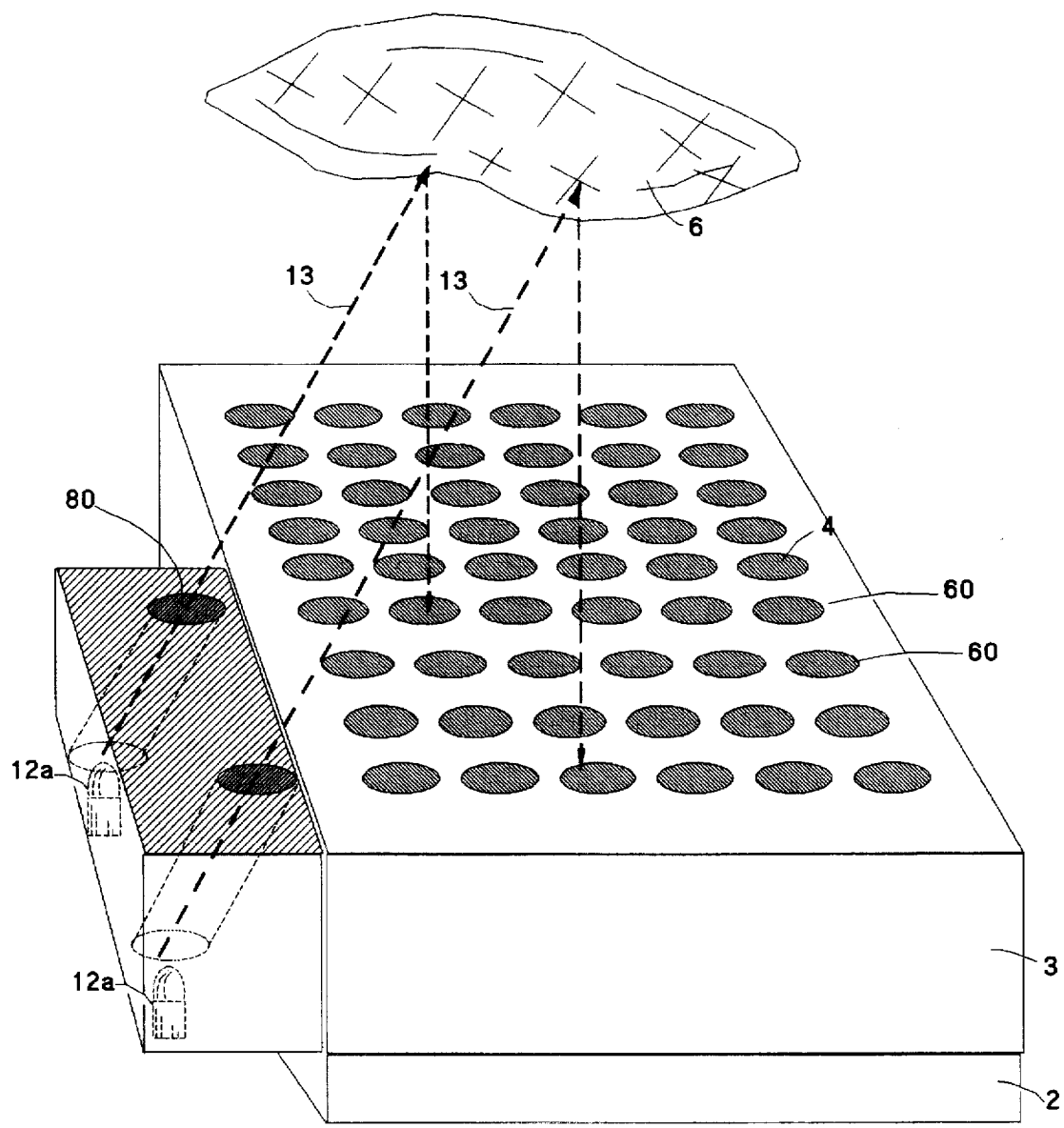
FIG. 11 shows the array of FIG. 10 with individual diffused light sources illuminating light passages to provide narrow, ranging beams of light to project onto a viewed object.

In FIG. 11, the diffuse light sources 12a provide light through light paths 80 to provide a narrow illuminating beam 13. This mode of illumination is akin to that of FIG. 4 except that the light emitted from each source 12a may be rendered identifiable by time multiplexing or color separation as described above in order to allow range information to be determined from triangulation.

In FIG. 12 an embodiment of the invention is shown in which the mask 3 is provided with multiple light pathways 21 that are not all parallel to each other. For simplicity, two classes are shown: a series 22 that is perpendicular to the light sensor surface; and an interleaved series 23 angled to the earlier series. The angular separation depicted is 5 degrees for light pathways 21 having an aspect ratio of 10:1. Each class of light pathways 22,23 has a respective cone of view 24,25. Where these cones or fields of view overlap stereo viewing and stereo ranging can be effected.

The outputs of the separate sensors associated with the series of light pathways 22, 23 can be analyzed in a processor 26 to produce a stereo representation of the viewed object 24, in this case a finger tip. This is shown in FIG. 12 wherein the output is a cathode ray tube (CRT) 27 or other display device that permits stereo viewing through the presentation of two stereo images distinguishable through color or time separation.

Alternately, such images may be used to provide a proximity measurement to an object, such as a finger 24. The processing of the two images generated by the two classes of light pathways 22, 23 is akin to the customary processing of stereo images for the reasons shown in FIGS. 13 and 14.

Figure 13:
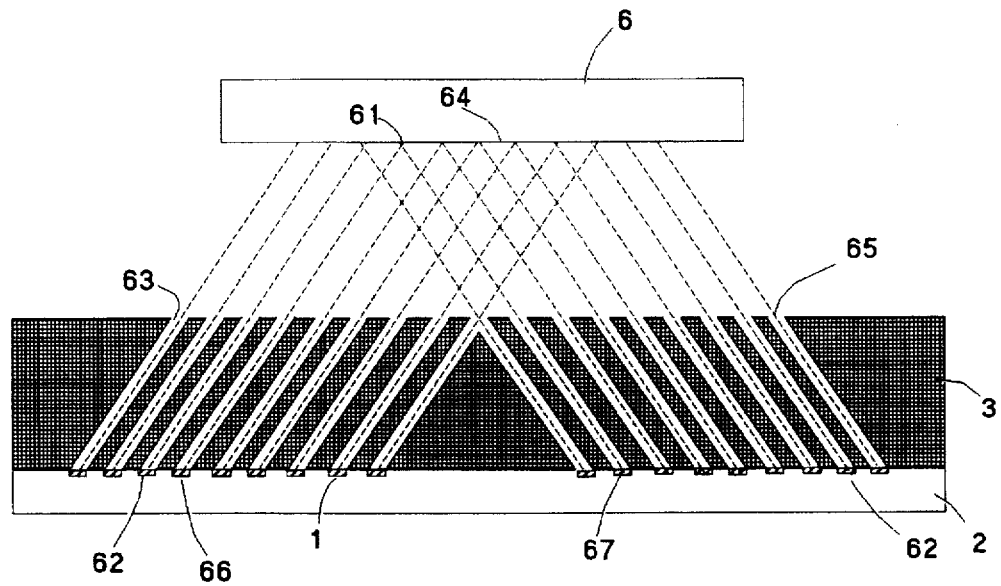
FIG. 13 shows the geometry for ranging or three dimensional, stereo vision using a multi-layer mask with dual overlapping light paths.
Figure 14:
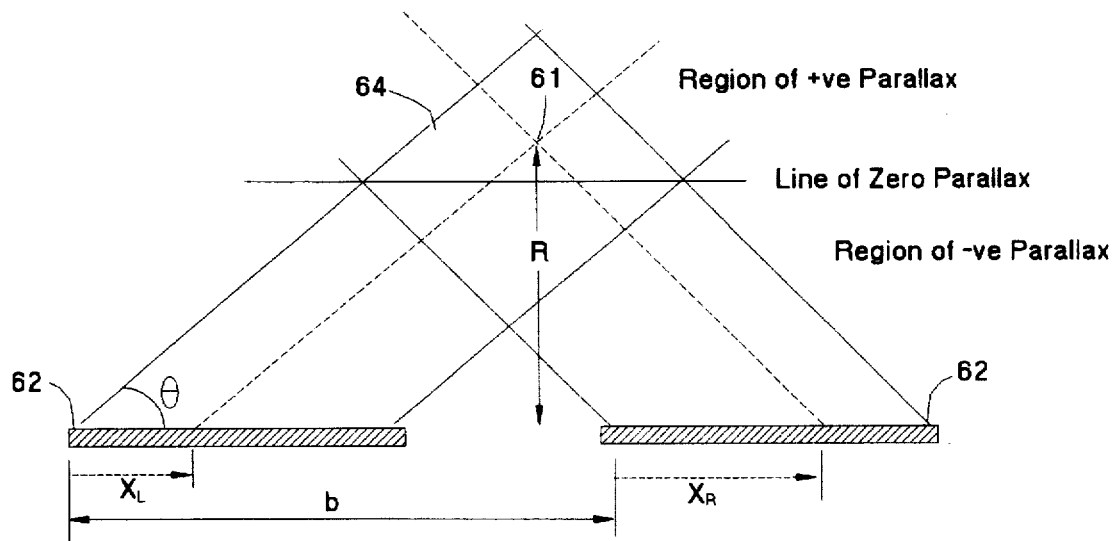
FIG. 14 shows the geometry for normal binocular vision as it may be transposed to the detector of FIG. 13.

In FIG. 14 a point 61 is viewed from two locations by two sensor arrays 62 (which may be sensor array portions of the invention as in FIG. 13). Each array 62 has associated, angled light pathways 63, 65 whose extensions overlap in a region 64. This is the geometry for normal binocular vision. In FIG. 13, the sensor array is a multi-layer sensor with two, overlapping fields of view. The presence of the point 61 is therefore "seen" by two separate sensors 66,67. From the fact that the same point 61 is seen by different sensors, the distance to the point 61 may be extracted geometrically. This may be understood by turning to FIG. 14.

If a feature or point 61 is imaged on both arrays, the range R to that point 61 can be computed from the difference in position of the feature 61 in the imaging plane. This difference is conventionally known as "parallax". The range R to a point found in both images is:

$$R = \frac{b+p}{2} \tan\theta$$

where $x_L$=position of feature in left image measured from a base point $x_R$=position of feature in right image measured from the base point b=stereo baseline by which the two arrays are displaced from each other.

θ=viewing angle and parallax is defined as:

$$p = x_R - x_L$$

As the stereo baseline b, is measured between two corresponding pixels (e.g. the left most pixel) in each array, then when two arrays overlap (e.g. by interleaving left and right pixels), the result presented above remains the same. FIG. 13 may also be understood to show the fields of view of a single sensor array having interleaved angled light pathways with the overlap suppressed to improve the clarity of the drawing.

The analysis with respect to FIGS. 13 and 14 may be applied to an array of sensors 1 simultaneously detecting multiple points 61 so as to identify the ranges of each point from the sensor array. From this data, a profile of the surface of an object 6 can be estimated, and correspondingly, a three dimensional image can be created.

Figure 15:
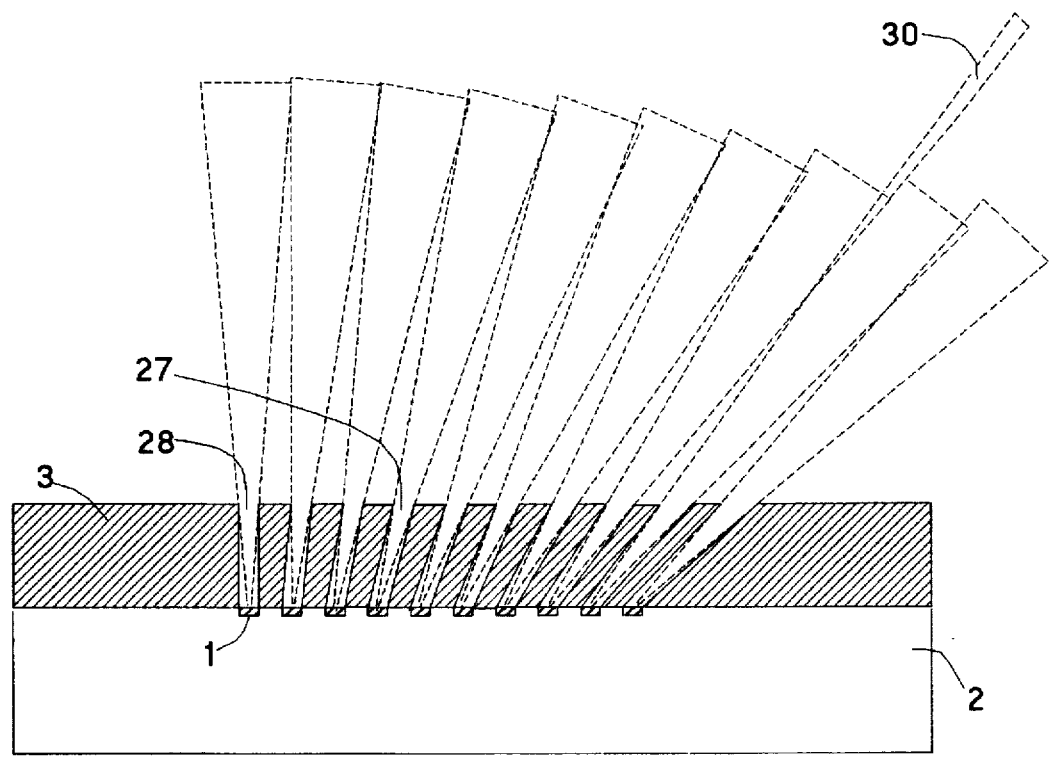
FIG. 15 shows a shadow mask with a series of progressively splayed light pathways providing a "fisheye" view.

FIG. 15 depicts a fish-eye type mask 3 having a series of light pathways 27, that are progressively, increasingly angled away from a central passageway 28. In FIG. 15, each light passageway 27 is shown as having an acceptance angle of 10 degrees and is rotated 5 degrees from the adjacent light passageway 27. This allows objects to be detected from the sides, as well as directly over the light sensing surface array.

Figure 16:
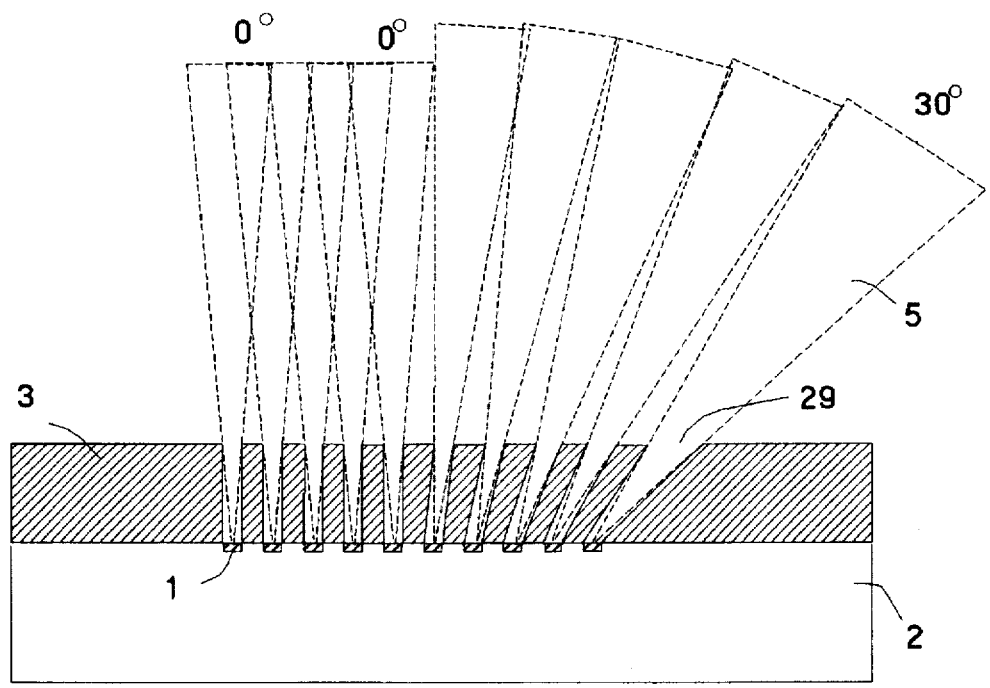
FIG. 16 shows a mask of FIG. 15 with the peripheral light paths being increasingly divergent to provide expanded fields of view for the more outwardly located sensors providing increased peripheral vision.

In FIG. 16 the field of view 5 of peripheral light pathways 4 may also vary across the mask 3. This is shown in FIG. 16 wherein the angle of the field of view of the pathways 29 increase, opening as proceeding towards the periphery of the mask 3. This permits a fewer number of pathways 29 to be splayed outwardly while still providing lateral sensitivity at the expense of loss of acuity.

Figure 17:
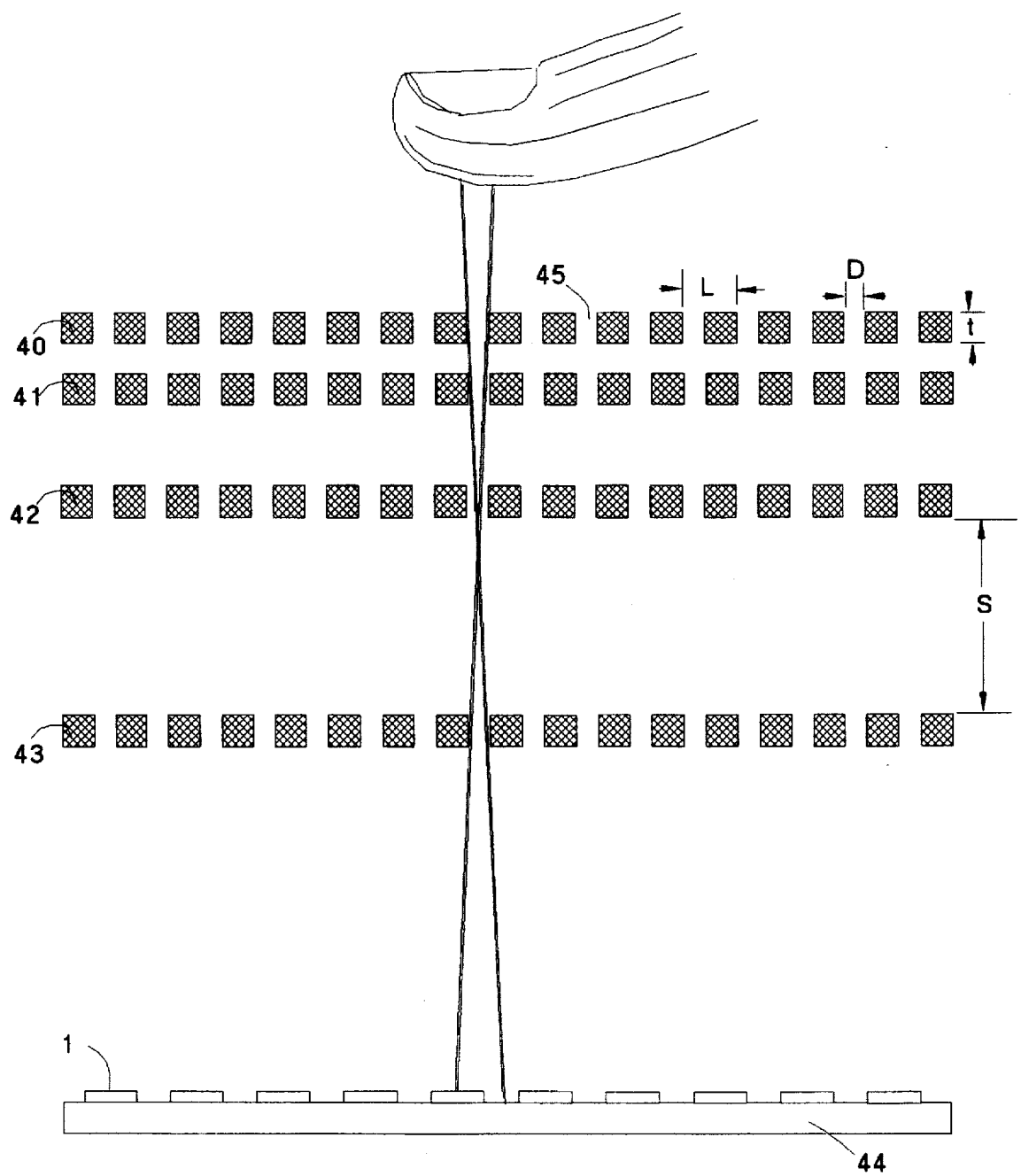
FIG. 17 shows the viewing of a finger print pattern through a multi-layer mask having four light-blocking layers of constant thickness.

In order to provide masks having well defined light pathways with high aspect ratios, it has been found that a multi-layer mask structure can perform equivalently to a solid mask. In FIG. 17 a series of 4 sheets 40, 41, 42, 43 are perforated by openings 45. The sheets have a thickness t. The holes 45 have a diameter D and are spaced at intervals L. The preferred spacing S between the respective layers is given by the formula:

$$S_n = [(L/D)^n - 1] \cdot t$$

In such a case, the multi-layer layers will provide an equivalent total mask thickness of:

$$T\!e\!f\!f = [(L/D)^{n+1} - 1] \cdot t (L/D - 1)$$

where the values for Teff, t, n, n+1, D and L are as listed above under the heading "Summary of the Invention".

The apertures 45 so formed may be maintained in register by fastening the sheets 40, 41, 41, 43 together as a unit. The light sensor array 44 may be located directly adjacent to the last sheet 43 or may be spaced below it by a distance up to that equivalent to the next permitted maximal spacing S given by the above formula, as if the light sensing array 44 were a further sheet as shown in FIG. 17. Thus, two occluding mask layers will provide an effective multi-layer mask. The benefits of the invention arise in such minimal case when the gap below the second mask layer is larger than the gap between the preceding two layers.

Figure 18:
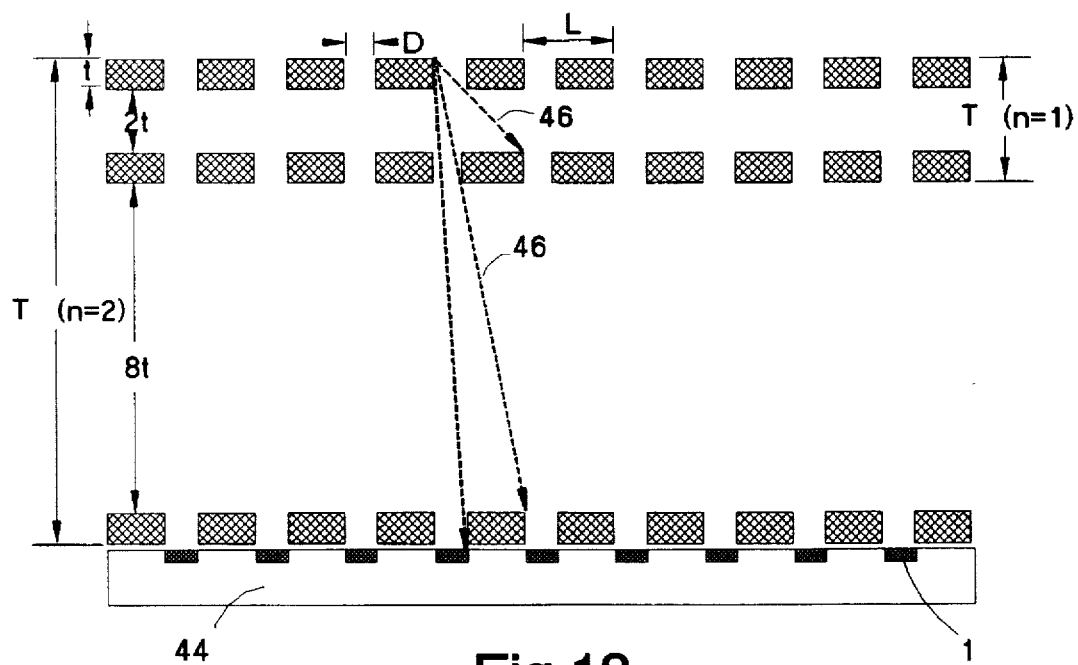
FIG. 18 shows a cross-section of a multi-layer mask with three blocking layers of constant thickness.

A three layer multi-layer mask with constant thickness layers and the photo detector array positioned closely to the bottom layer is shown in FIG. 18. Light rays 46 blocked by the progressive layers of this mask are shown in FIG. 18.

Figure 19:
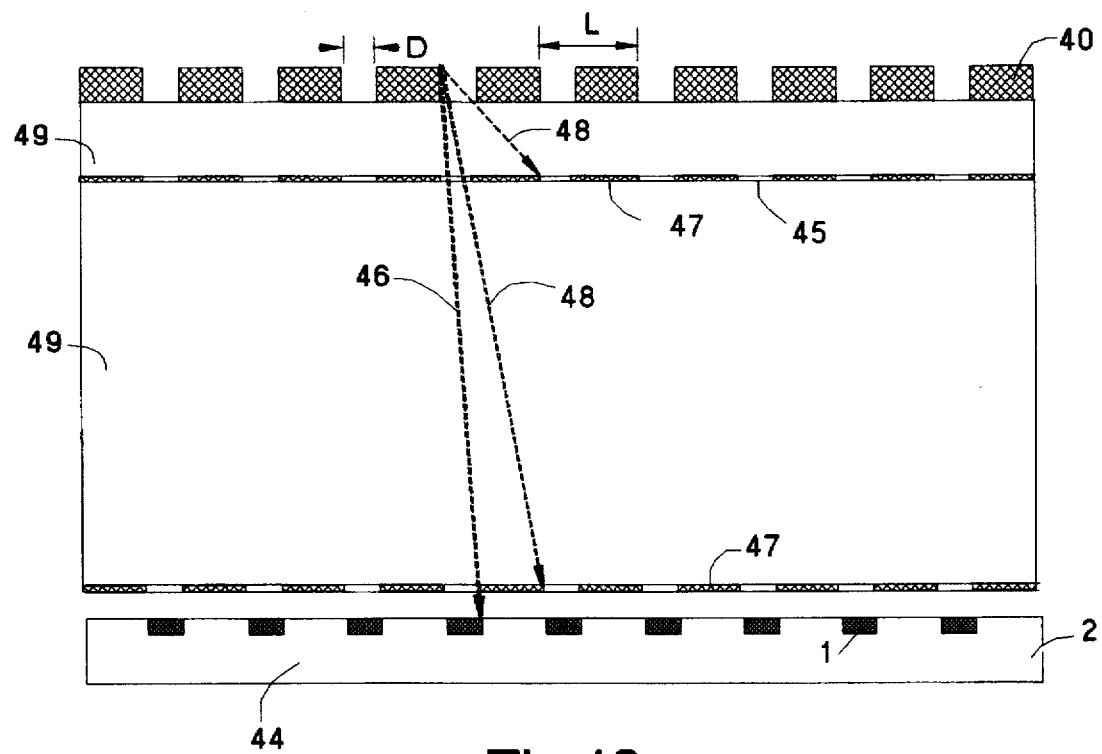
FIG. 19 shows a multi-layer multi-layer mask with a single top layer of a given thickness and two further blocking "thin" layers of minimal thickness.

In FIG. 19 the layers below the first layer 40 of FIG. 17 are replaced by thin opaque sheets 47. In this multi-layer mask, the maximum spacing between sheets 47 is given by:

$$S_n = (L/D)^{n-1}(L/D-1)t$$

and the multi-layer mask will provide a total effective mask thickness of:

$$T\!e\!f\!f = (L/D)^n \cdot t$$

wherein the values for Teff, t, n, S(n), and L are as listed above under the title "Summary of the Invention".

Samples of blocked rays 48 are indicated in this FIG. 19.

The advantage of the multi-layer mask configuration of FIG. 19 is that the thin sheets 47 may be easily deposited on transparent spacing material 49 and etched by photo lithography or laser ablation to provide apertures 45.

In the case of both multi-layer masks, the spacings between layers or sheets 47, preferentially increase as proceeding towards the sensors 1. In particular, the gap below the second layer should be larger than the gap between the prior two layers.

Figure 20:
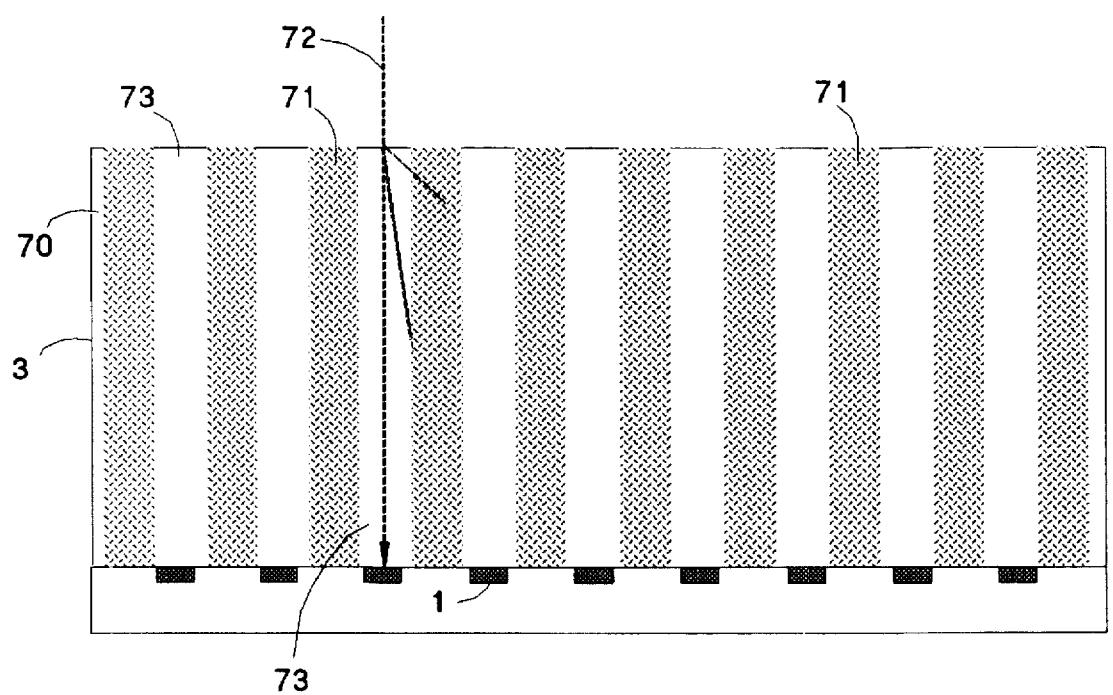
FIG. 20 shows an occluding mask formed from a transparent layer wherein light blocking regions have been formed.

A further alternate means for creating an occluding mask 3 with high aspect light pathways 4 is to render portions of a transparent mask material selectively opaque. This is depicted in FIG. 20 wherein a transparent polycarbonate sheet 70 has been exposed to intense laser illumination with light of a frequency that will cause the mask material to become opaque in the illuminated region. This can occur from micro-crazing that forms in the presence of intense light.

The resulting opaque regions 71 can then serve as a "light curtain" to prevent cross-illumination of sensors 1 from light entering the mask 72. Light passing along the transparent paths 73 can still reach the sensors 1.

Yet a further alternate means of providing a mask 3 is to combine two louvred masks oriented at 90 degrees to each other. A product of this type is marked by the 3M Corporation of Minneapolis, Minn., U.S.A. under the designation "Light Control Film". This product consists of a sheet of micro-louvres that simulate a highly miniaturized venetian blind.

Figure 21:
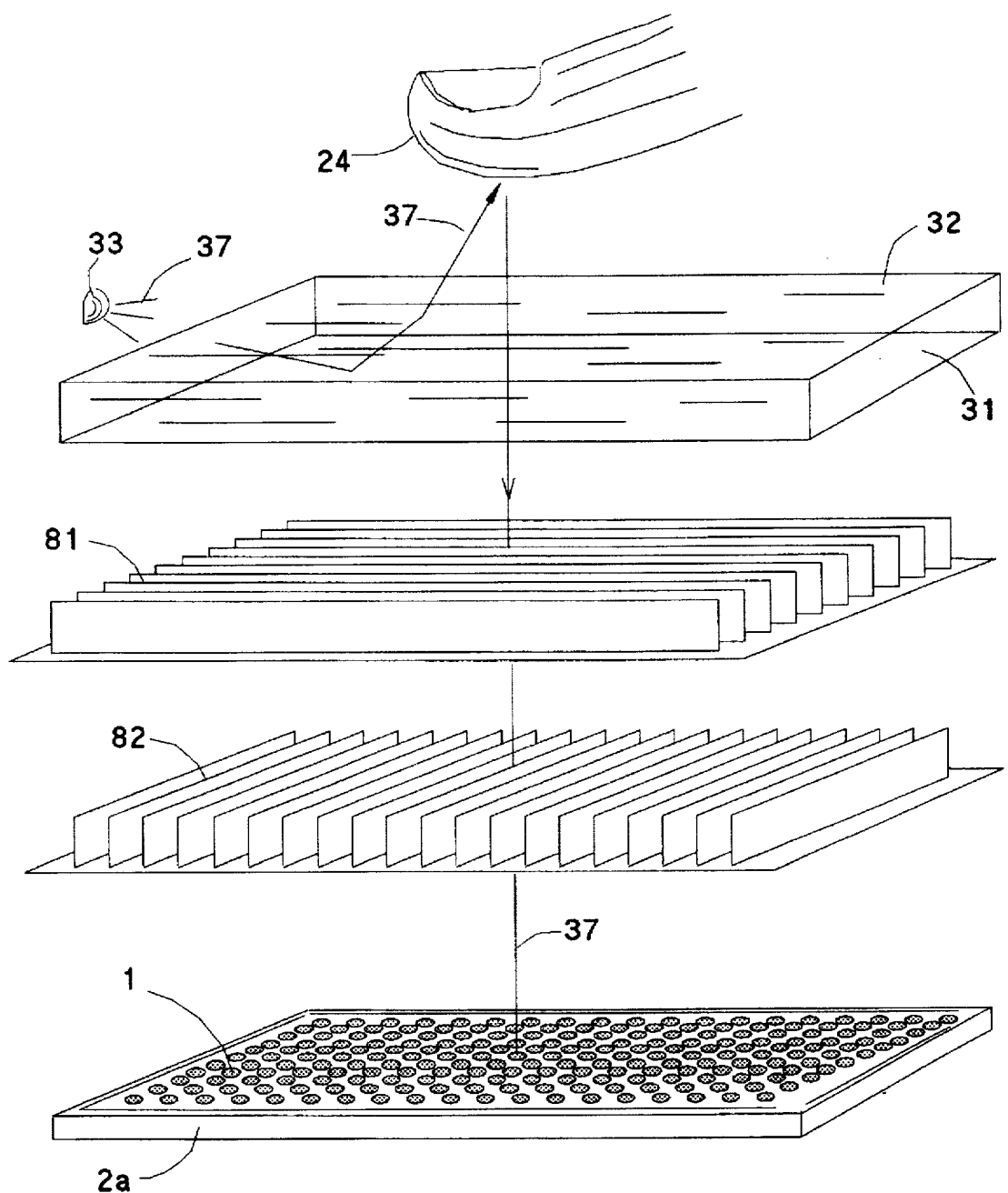
FIG. 21 depicts the imaging system of FIG. 2 wherein the mask consists of two micro-louvred screens oriented at right angles to each other.

A system based upon such an arrangement is shown in FIG. 21 where first 81 and second 82 micro-louvre sheets are oriented at 90 degrees to each other. Alternatively, micro-louver sheets 81 and 82 could be manufactured as one unit, forming rectangular cells with light passageways similar to those shown in FIG. 20. Otherwise the components of FIG. 21 are as designated in FIG. 2.

CONCLUSION

The foregoing has constituted a description of specific embodiments showing how the invention may be applied and put into use. These embodiments are only exemplary. The invention in its broadest, and more specific aspects, is further described and defined in the claims which now follow.

These claims, and the language used therein, are to be understood in terms of the variants of the invention which have been described. They are not to be restricted to such variants, but are to be read as covering the full scope of the invention as is implicit within the invention and the disclosure that has been provided herein.

The embodiments of the invention in which an exclusive property are claimed as follows:

1. An electromagnetic ray sensing system for viewing a viewed object that has its surface illuminated with electromagnetic radiation below the X-ray range of the spectrum down to and including the far infrared region comprising:

(a) an electromagnetic ray or light detector having a series of individual light sensor regions positioned across the surface of the detector for receiving and sensing illumination by electromagnetic radiation within the far infra-red to, but not including, the X-ray range, said sensor regions being connected through a sensor output to provide output signals corresponding to the intensity and location of the electromagnetic radiation received by each of the individual light sensor regions in the series of light sensor regions of the detector; and (b) an occluding mask positioned to cover said light sensor regions, such mask having a specific depth and multiple light pathways extending through the depth of the mask, each pathway having entrance and exit openings and each pathway having an aspect ratio of at least 3 to 1, in terms of the depth to width for each pathway, each of said light pathways being positioned to provide access for rays of electromagnetic illumination to arrive at and illuminate respectively associated light sensor regions on the detector surface wherein each light pathway provides for the direct, straight line transmission of illumination through the depth of the mask, from said entrance to said exit openings, to provide each of such light sensor regions with a limited conical field of view that is bounded by the straight-line extensions of points on the edges of said entrance and exit openings, and wherein the mask is provided with non-reflecting, absorbing, radiation blocking surfaces for blocking received electromagnetic rays entering a specific light pathway from cross-illuminating other sensor regions on the detector surface than the specific light sensor region being illuminated through said specific associated light pathway.

2. A system as in claim 1 further comprising a source of illumination for the viewed object.

3. A system as in claim 2 wherein the source of illumination is a light emitting panel surmounted on the occluding mask, such panel having light transmitting regions that are in alignment with the light pathways of the mask.

4. A system as in claim 2 wherein the occluding mask is surmounted by a transparent cover having an upper surface wherein the source of illumination provides light laterally to enter within said cover and illuminate a viewed object positioned on or above the upper surface.

5. A system as in claim 2 in combination with a translucent object wherein the source of illumination is located on the side of the object remote from the occluding mask.

6. A system as in claim 2 comprising illuminating light passageways passing through the occluding mask and positioned to receive light from the source of illumination located on the side of the mask remote from the viewed object whereby light to illuminate areas on the viewed object passes through the mask.

7. A system as in claim 2 wherein the source of illumination cyclically changes through differing colors to provide signals through the sensor output that correspond to consecutive monochrome illuminations of the viewed object in each of the differing colors.

8. A system as in claim 1 wherein multiple classes of light pathways are present, each class of light pathway being provided with color filter means for a specific color whereby a representation of the viewed object in color can be provided through the sensor output.

9. A system as in claim 1 wherein a portion of such pathways are non-parallel to other pathways.

10. A system as in claim 9 comprising multiple classes of light pathways wherein one primary class of the classes of light pathways receives light from directly above the detector and one or more other classes of light pathways receive light from regions peripheral to that received by the primary class of light pathways.

11. A system as in claim 9 wherein the light pathways allowing illumination of the central portion of the detector surface are in substantially parallel alignment, and the light pathways at the periphery of the detector surface are angled outwardly, away from the central portion of the detector surface.

12. A system as in claim 9 wherein substantially all light pathways are angled outwardly, away from the central portion of the detector surface.

13. A system as in claim 9 wherein said pathways comprise first and second classes of light pathways classes which have overlapping fields of view and are connected through the sensor output to stereo image processing means whereby a viewed scene lying within the overlapping fields of view is analyzed stereoscopically to provide an output that is an indication of the proximity of the viewed object.

14. A system as in claim 9 wherein said pathways comprise first and second classes of light pathways which classes have overlapping fields of view and are connected through the sensor output to stereo image processing means whereby a viewed scene lying within the overlapping fields of view is analyzed stereoscopically to provide an output that is indication of the three dimensional shape of the surface of the viewed object.

15. A system as in claim 13 wherein the members of the first class of light pathways are separated laterally from the members of the second class of light pathways.

16. A system as in claim 13 wherein the members of the first class of light pathways are interleaved with the members of the second class of light pathways.

17. A system as in claim 2 wherein the source of illumination provides a beam of light directed towards a viewed object at a predetermined angle with respect to the detector surface and further comprising a triangulation proximity detection means coupled to the sensor output that provides an indication of the proximity of a point of illumination of the beam of light on the viewed object based upon triangulation ranging.

18. A system as in claim 17 having multiple beams of light, each beam being oriented spatially to illuminate exclusively, by reflection off of a viewed object, an associated series of sensor regions within the detector.

19. A system as in claim 18 wherein said multiple beams are oriented at differing angles of elevation above the mask.

20. A system as in claim 18 having multiple overlapping beams wherein more than one beam is positioned to illuminate a specific sensor region, and further comprising time multiplexing means for releasing light consecutively from the overlapping beams whereby the illumination from said overlapping beams can be distinguished from each other.

21. A system as in claim 18 having multiple overlapping beams, said overlapping beams differing in their color and further comprising color filter means mounted over the sensors whereby the illumination from said overlapping beams can be distinguished from each other.

22. A system as in claim 1 wherein the mask is of multi-layer structure, having at least two top and second occluding mask layers positioned in a spaced relationship above the surface of the detector, each of said layers having light-passing holes formed therein that are in alignment to define the light pathways, the top layer having a thickness, the thickness of the top layer and the spacing intervals between the top and second layers, and between the surface of the detector and the next upper layer, being dimensioned to prevent, when exposed to illumination from any direction, any cross-illumination by incoming light of light sensor regions through more than one light pathway.

23. A system as in claim 22 wherein layers below the top layer of the mask are thinner than the top layer.

24. A system as in claim 22 wherein the spacing interval S between layers is given by the formula $$S_n \leq [(L/D)^n - 1] \cdot t$$

and the multi-layer layers provide an equivalent total mask thickness of:

$$T_{eff} = [(L/D)^{n+1} - 1] \cdot t/(L/D - 1)$$

where:

Teff is the effective thickness of the multi-layer mask from the top of the first layer to the bottom of the bottom layer t is the thickness of each individual layer n is the count of spaces present between layers n+1 is the total number of layers present D is the diameter of the holes in each mask sheet L is the hole-to-hole separation, or interval within the mask sheets.

25. A system as in claim 23 wherein the spacing interval S between layers is given by the formula $$S_n \leq (L/D)^{n-1}(L/D-1)t$$

and the multi-layer layers provide a total effective mask thickness of:

$$Teff = (L/D)^n \cdot t$$

wherein:

Teff is the total effective thickness of the structure with n spaces from the top of the first layer to the bottom of the bottom sheet t is the thickness of the first, uppermost layer, the layers or sheets below being of negligible thickness n is the count of spaces between the sheets S(n) is the separation between mask sheets for the nth spacing D is the diameter of the holes in each mask sheet L is the hole-to-hole separation in each sheet.

26. A sensing system as in claim 1 wherein the detector comprises charge coupled device.

27. A sensing system as in claim 1 wherein the detector comprises a position sensing device.

28. A system as in claim 1, further comprising:

(a) an image presentation means for providing a representation of a viewed object; and (b) an image processing means coupled between the sensor output and the image presentation means for activating the image presentation means in response to signals originated by the array of sensors to provide a vision system.

29. A system as in claim 1 wherein the mask comprises solid transparent regions that correspond with the light pathways and the regions within the mask between such light pathways that are solid and opaque.

30. A system as in claim 1 wherein the mask comprises in a plurality of crossed louvres which provide the radiation blocking surfaces.

31. A system as in claim 1 wherein the series of light sensor regions are distributed in a linear array.

* * * * *